(12) United States Patent
Kalous et al.

(10) Patent No.: US 10,094,885 B2
(45) Date of Patent: Oct. 9, 2018

(54) PREDICTIVE BATTERY WARNINGS FOR AN ELECTRONIC LOCKING DEVICE

(71) Applicant: Master Lock Company LLC, Oak Creek, WI (US)

(72) Inventors: Scott Kalous, Kenosha, WI (US); John Bartucci, Crystal Lake, IL (US); Cris Smyczek, Greenfield, WI (US); Nathan Conrad, Oak Creek, WI (US)

(73) Assignee: Master Lock Company LLC, Oak Creek, WI (US)

( * ) Notice: Subject to any disclaimer, the term of this patent is extended or adjusted under 35 U.S.C. 154(b) by 0 days.

(21) Appl. No.: 15/846,078

(22) Filed: Dec. 18, 2017

(65) Prior Publication Data

US 2018/0106871 A1    Apr. 19, 2018

Related U.S. Application Data

(63) Continuation of application No. 14/524,558, filed on Oct. 27, 2014.

(51) Int. Cl.
*G01R 31/36* (2006.01)
*G07C 9/00* (2006.01)

(52) U.S. Cl.
CPC ..... *G01R 31/3679* (2013.01); *G07C 9/00571* (2013.01)

(58) Field of Classification Search
CPC .............. G01R 19/165; G01R 31/3679; G07C 9/00571
See application file for complete search history.

(56) References Cited

U.S. PATENT DOCUMENTS

| 5,565,858 | A | 10/1996 | Guthrie |
| 5,648,763 | A | 7/1997 | Long |
| 6,046,558 | A | 4/2000 | Larson et al. |
| 6,047,575 | A | 4/2000 | Larson et al. |
| 6,081,199 | A | 6/2000 | Hogl |
| 6,337,618 | B1 | 1/2002 | Craig et al. |

(Continued)

FOREIGN PATENT DOCUMENTS

| EP | 2 273 719 A2 | 1/2011 |
| WO | WO-2010/151902 A1 | 12/2010 |

(Continued)

OTHER PUBLICATIONS

International Search Report and Written Opinion, PCT/US2015/042743, Master Lock Company LLC, 15 pages (dated Dec. 28, 2015).

(Continued)

*Primary Examiner* — Brian Wilson
(74) *Attorney, Agent, or Firm* — Foley & Lardner LLP

(57) ABSTRACT

Disclosed herein are methods, systems, and computer-readable media for operating an electronic locking device. The disclosed methods include a method of predicting a battery life of an electronic locking product based at least in part on a usage history of the electronic locking product. The predicted battery life may include an adjustment based on received weather information relating to a location of the electronic locking device. The disclosed methods include a method of sharing an unlocking code to an electronic locking product by a first user to a second user.

15 Claims, 12 Drawing Sheets

(56) References Cited

U.S. PATENT DOCUMENTS

| | | |
|---|---|---|
| 7,183,894 B2 | 2/2007 | Yui et al. |
| 7,782,200 B1 | 8/2010 | Fleischmann |
| 8,866,639 B2 | 10/2014 | Kleindienst et al. |
| 8,922,333 B1 | 12/2014 | Kirkjan |
| 8,943,187 B1 | 1/2015 | Saylor |
| 9,316,454 B2 | 4/2016 | Milde, Jr. |
| 9,460,480 B2 | 10/2016 | Woodard et al. |
| 9,508,206 B2 * | 11/2016 | Ahearn ............... G07C 9/00174 |
| 9,600,949 B2 | 3/2017 | Conrad et al. |
| 9,672,672 B2 | 6/2017 | Ranchod |
| 2002/0099945 A1 | 7/2002 | McLintock et al. |
| 2002/0180582 A1 | 12/2002 | Nielsen |
| 2003/0102957 A1 | 6/2003 | Crisp |
| 2003/0179073 A1 | 9/2003 | Ghazarian |
| 2004/0108938 A1 | 6/2004 | Entrekin |
| 2004/0172535 A1 | 9/2004 | Jakobsson et al. |
| 2004/0255623 A1 | 12/2004 | Sun et al. |
| 2005/0044906 A1 | 3/2005 | Spielman |
| 2005/0099262 A1 | 5/2005 | Childress et al. |
| 2005/0264397 A1 | 12/2005 | Coelho et al. |
| 2006/0072755 A1 | 4/2006 | Oskari |
| 2006/0121951 A1 | 6/2006 | Perdomo et al. |
| 2006/0250235 A1 | 11/2006 | Astrin |
| 2006/0255128 A1 | 11/2006 | Johnson et al. |
| 2006/0288744 A1 | 12/2006 | Smith |
| 2007/0018787 A1 | 1/2007 | Martinez De Velasco Cortina et al. |
| 2007/0200671 A1 | 8/2007 | Kelley et al. |
| 2007/0234052 A1 | 10/2007 | Campisi |
| 2007/0290797 A1 | 12/2007 | Harkins et al. |
| 2007/0290799 A1 | 12/2007 | Harkins et al. |
| 2008/0061191 A1 | 3/2008 | Gochnour |
| 2009/0136035 A1 | 5/2009 | Lee |
| 2009/0183541 A1 | 7/2009 | Sadighi et al. |
| 2009/0184801 A1 | 7/2009 | Bliding et al. |
| 2009/0231093 A1 | 9/2009 | Keller et al. |
| 2009/0306888 A1 | 12/2009 | May et al. |
| 2009/0320538 A1 | 12/2009 | Pellaton |
| 2010/0073129 A1 | 3/2010 | Pukari |
| 2010/0075656 A1 | 3/2010 | Howarter et al. |
| 2011/0050419 A1 | 3/2011 | Ng et al. |
| 2011/0167488 A1 | 7/2011 | Roy et al. |
| 2011/0234397 A1 | 9/2011 | Fetzer et al. |
| 2011/0252233 A1 | 10/2011 | De Atley et al. |
| 2011/0291803 A1 | 12/2011 | Baj Ic et al. |
| 2011/0307394 A1 | 12/2011 | Rzepecki |
| 2011/0311052 A1 | 12/2011 | Myers et al. |
| 2012/0001757 A1 | 1/2012 | Jung et al. |
| 2012/0011366 A1 | 1/2012 | Denison |
| 2012/0073338 A1 | 3/2012 | Mohla |
| 2012/0074223 A1 | 3/2012 | Habraken |
| 2012/0176107 A1 | 7/2012 | Shrivas et al. |
| 2012/0222103 A1 | 8/2012 | Bliding et al. |
| 2012/0227450 A1 | 9/2012 | Ufkes |
| 2012/0268239 A1 | 10/2012 | Ljung et al. |
| 2012/0268244 A1 | 10/2012 | Ljung et al. |
| 2012/0280784 A1 | 11/2012 | Gaviria Velez et al. |
| 2012/0280790 A1 | 11/2012 | Gerhardt et al. |
| 2013/0017812 A1 | 1/2013 | Foster |
| 2013/0031375 A1 | 1/2013 | Lin |
| 2013/0036781 A1 | 2/2013 | Hartmann et al. |
| 2013/0043973 A1 | 2/2013 | Greisen et al. |
| 2013/0099862 A1 | 4/2013 | Yu et al. |
| 2013/0099892 A1 | 4/2013 | Tucker et al. |
| 2013/0125231 A1 | 5/2013 | Kuenzi |
| 2013/0127593 A1 | 5/2013 | Kuenzi et al. |
| 2013/0139561 A1 | 6/2013 | Parto et al. |
| 2013/0159704 A1 | 6/2013 | Chandrasekaran |
| 2013/0176107 A1 | 7/2013 | Dumas et al. |
| 2013/0237193 A1 | 9/2013 | Dumas et al. |
| 2013/0244684 A1 | 9/2013 | Kadous et al. |
| 2013/0255335 A1 | 10/2013 | Jonely |
| 2013/0293368 A1 | 11/2013 | Ottah et al. |
| 2013/0311764 A1 | 11/2013 | Alpert et al. |
| 2013/0318519 A1 * | 11/2013 | Coolidge .................. G06F 8/65 717/173 |
| 2013/0325521 A1 | 12/2013 | Jameel et al. |
| 2013/0332370 A1 * | 12/2013 | Hyde ................ B60L 11/1822 705/306 |
| 2013/0335193 A1 | 12/2013 | Hanson et al. |
| 2013/0342314 A1 | 12/2013 | Chen et al. |
| 2014/0033774 A1 | 2/2014 | Ofchus et al. |
| 2014/0049361 A1 | 2/2014 | Ahearn et al. |
| 2014/0049363 A1 | 2/2014 | Ahearn et al. |
| 2014/0049367 A1 | 2/2014 | Ahearn et al. |
| 2014/0049368 A1 | 2/2014 | Ahearn et al. |
| 2014/0049369 A1 | 2/2014 | Ahearn et al. |
| 2014/0051355 A1 | 2/2014 | Ahearn et al. |
| 2014/0107196 A1 | 4/2014 | Sagar et al. |
| 2014/0120905 A1 | 5/2014 | Kim |
| 2014/0150502 A1 | 6/2014 | Duncan |
| 2014/0151079 A1 * | 6/2014 | Furui ....................... B25F 5/02 173/46 |
| 2014/0162600 A1 | 6/2014 | Chang et al. |
| 2014/0215882 A1 | 8/2014 | Milde, Jr. |
| 2014/0218167 A1 | 8/2014 | Tseng |
| 2014/0232524 A1 | 8/2014 | Nakai et al. |
| 2014/0250954 A1 | 9/2014 | Buzhardt |
| 2014/0266588 A1 | 9/2014 | Majzoobi |
| 2014/0375422 A1 | 12/2014 | Huber et al. |
| 2015/0022315 A1 | 1/2015 | Ng et al. |
| 2015/0067792 A1 | 3/2015 | Benoit et al. |
| 2015/0102902 A1 | 4/2015 | Chen |
| 2015/0170447 A1 | 6/2015 | Buzhardt |
| 2015/0170448 A1 | 6/2015 | Robfogel et al. |
| 2015/0184963 A1 | 7/2015 | Milde, Jr. |
| 2015/0221152 A1 | 8/2015 | Andersen |
| 2015/0292244 A1 | 10/2015 | Beatty |
| 2015/0312531 A1 | 10/2015 | Samad et al. |
| 2015/0332533 A1 | 11/2015 | Meganck |
| 2016/0033222 A1 | 2/2016 | Milde, Jr. |
| 2016/0035163 A1 | 2/2016 | Conrad et al. |
| 2016/0036788 A1 | 2/2016 | Conrad et al. |
| 2016/0036814 A1 | 2/2016 | Conrad et al. |
| 2016/0049026 A1 | 2/2016 | Johnson |
| 2016/0049032 A1 | 2/2016 | Ranchod |
| 2016/0077159 A1 * | 3/2016 | Petrucelli ............. G01R 31/362 324/426 |
| 2016/0116510 A1 | 4/2016 | Kalous et al. |
| 2017/0030109 A1 | 2/2017 | Duncan et al. |

FOREIGN PATENT DOCUMENTS

| | | |
|---|---|---|
| WO | WO2014/007870 A1 | 1/2014 |
| WO | WO-2014/107196 A1 | 7/2014 |
| WO | WO-2016/019064 A1 | 2/2016 |

OTHER PUBLICATIONS

International Search Report and Written Opinion, PCT/US2015/042745, Master Lock Company LLC, 10 pages (dated Nov. 2, 2015).

International Search Report and Written Opinion, PCT/US2015/057402, Master Lock Company LLC, 10 pages (dated Feb. 18, 2016).

International Search Report and Written Opinion, PCT/US2016/056781, Master Lock Company LLC, 11 pages (dated Nov. 4, 2016).

\* cited by examiner

PREDICTIVE BATTERY WARNINGS FOR AN ELECTRONIC LOCKING DEVICE

CROSS-REFERENCE TO RELATED PATENT APPLICATIONS

This application is a continuation of U.S. application Ser. No. 14/524,558, filed Oct. 27, 2014, which is incorporated herein by reference in its entirety.

BACKGROUND

Recently, electronic locks have become commercially available. Such electronic locks may be capable of being controlled by a user device over a wireless connection (e.g., Wi-Fi, etc.). However, the communications that are used to interface with such electronic locks are often not overly secure, which increases the risk that an unauthorized user may gain control of the lock.

SUMMARY

Disclosed herein are methods, systems, and computer-readable media for operating an electronic locking device. One embodiment relates to a method of predicting a battery life of an electronic locking product based at least in part on a usage history of the electronic locking product. The method includes receiving, at a server, lock event information associated with a lock event of the electronic locking product from a portable device. The method further includes storing, in a database of the server, the lock event information, wherein the lock event information is associated with the electronic locking product in the database. The method includes calculating, by the server, an expected battery life of a battery of the electronic locking product based at least in part on the lock event information. The method further includes determining, by the server, that the expected battery life of the battery is below a threshold value. The method includes initiating, by the server, an alert to a user computing device indicating a low battery condition of the battery in response to determining that the expected battery life is below the threshold value.

Another embodiment relates to a locking product system. The locking product system includes a backend server. The backend server includes a processor operably coupled to memory. The processor is configured to receive lock event information associated with a lock event of an electronic locking product from a user computing device; store the lock event information in a database of the backend server, where the lock event information is associated with the electronic locking product in the database; calculate an expected battery life of a battery of the electronic locking product using the lock event information, the expected battery life comprising an expected amount of time associated with a remaining charge of the battery based at least in part on usage indicated by the lock event information; determine that the expected battery life of the battery is below a threshold value; and initiate an alert to the user computing device indicating a low battery condition of the battery Yet another embodiment relates to a locking product system. The locking product system includes a non-transitory computer-readable storage medium. The non-transitory computer-readable storage medium has instructions stored thereon that, upon execution by a processor of a computing device, cause the processor to receive lock event information associated with a lock event of an electronic locking product; store the lock event information in a database, where the lock event information is associated with the electronic locking product in the database; calculate an expected battery life of a battery of the electronic locking product using the lock event information, the expected battery life comprising an expected amount of time associated with a remaining charge of the battery based at least in part on usage indicated by the lock event information; determine that the expected battery life of the battery is below a threshold value; and initiate an alert on at least one of the computing device or a second computing device indicating a low battery condition of the battery.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

Figure 1:
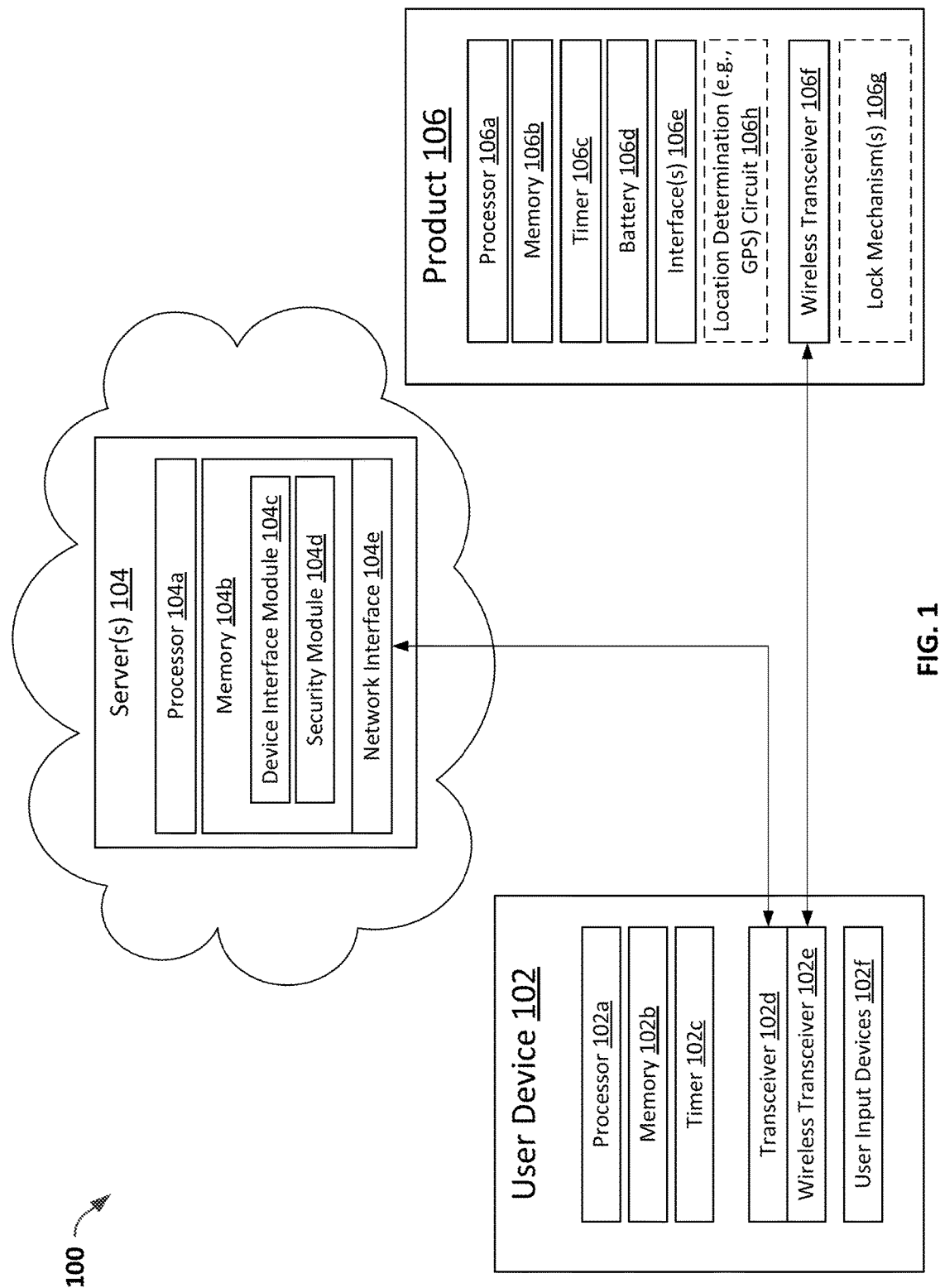
FIG. 1 is a block diagram of a system for wireless key management for authentication, according to an embodiment.

The details of one or more implementations of the subject matter described in this specification are set forth in the accompanying drawings and the description below. Other features, aspects, and advantages of the subject matter will become apparent from the description, the drawings, and the claims.

Like reference numbers and designations in the various drawings indicate like elements. Before turning to the detailed description, which describes the exemplary embodiments in detail, it should be understood that the application is not limited to the details or methodology set forth in the description or illustrated in the figures. It should also be understood that the terminology is for the purpose of description only and should not be regarded as limiting.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

Described herein are techniques for wireless key management for authentication. According to the disclosure herein, additional security is provided to wireless communications between a user device (e.g., a mobile phone, a laptop, a tablet device, etc.) and a product (e.g., an electronic locking device, such as a padlock, door lock, lock box, etc.) via an authentication scheme that utilizes a server and an encryption scheme that uses at least two keys. In scenarios where a user device is configured to control or manage the operation of the product, the use of the disclosed authentication and encryption systems is desirable to ensure that the product is being validly controlled. Throughout this disclosure, embodiments are discussed with reference to a user device of a mobile phone and a product of an electronic locking device. However, the present disclosure is not limited to implementations that use a mobile phone and an electronic locking device, and embodiments that utilize other types of user devices and products are within the scope of this disclosure.

According to some exemplary embodiments, the disclosed approach is based on encryption using two keys. One key (e.g., a secret key) is known/stored on the product (an electronic locking device) and the server (a management system). The other key (e.g., an access key) is known/stored on the lock and the user device (a mobile phone). Both the secret and access keys are specific to the lock/product. In this manner, the secret and access keys may uniquely relate to a single lock/product. The secret key may be used to encrypt a file (e.g., a user profile) that can be used to determine a user's access rights to the lock/product. For example, such access rights may define when a user can remotely access the lock/product or when the user can otherwise control the device (e.g., lock or unlock an electronic locking device). The access key can be used by the user device in initiating communications with the lock/product, and also may be used as part of a challenge-response exchange between the user device and lock/product.

The keys discussed herein may also be used to authenticate that data is valid, and also came from the other holder of the corresponding key. Such data integrity and source authentication/authenticity verification may be performed by computing a MAC (message authentication code) of the data transmitted (e.g., using the secret key or access key). Accordingly, as discussed further herein, when a server encrypts a user profile, a device that receives the encrypted profile (e.g., a locking device) may use its copy of the secret key to verify that the MAC is correct. Similarly, when a lock is transmitting data, it may use its secret key to compute a MAC to be verified by a server (if the data is intended for the server), and the server may use its secret key to verify the MAC. Alternatively, any of the communications discussed herein may be unencrypted (e.g., plaintext packets, etc.), and a MAC may be computed for transmitted data and included with the transmitted data. The MAC may then be used as a security measure to verify that data is being transmitted from a legitimate source. Additionally, when a lock and mobile device are communicating, each may use their copies of the access key to compute a MAC, and each device may verify the data and authenticate its source using the access key. Accordingly, such use of a MAC can ensure that data is coming from the proper source (i.e., the server, mobile device, or the lock), and also that the data is valid.

Referring to FIG. 1, a block diagram of a system 100 for wireless key management for authentication is shown, according to an embodiment. System 100 includes at least one user device 102, server 104, and product 106. In an illustrative embodiment, user device 102 is a mobile device (e.g., a mobile phone) and product 106 is an electronic locking device. In general, user device 102 is configured to at least partially manage the operation of product 106. For example, a mobile phone may be used to unlock, lock, and otherwise manage the function of an electronic locking device. User device 102 includes components necessary for such product management (e.g., a processor 102a, memory 102b, timer 102c, transceivers 102d and 102e, user input devices 102f, etc.). Processor 102a may be any commercially available processor, may represent one or more processors, and may be implemented as a general-purpose processor or an application specific integrated circuit. Memory 102b may include the memory of processor 102a (e.g., cache), RAM, or other storage (flash memory, hard disk storage, etc.). Timer 102c is configured to maintain a time value for user device 102. For example, timer 102 may be the clock of processor 102a, or may be any other time keeping circuit of device 102. The time value maintained by timer 102c may be used in secured communications as discussed further herein (e.g., in syncing time with product 106, in providing timestamps related to events for logging purposes, etc.). Transceivers 102d and 102e may include various types of transceivers for different protocols of communication. In one embodiment, transceiver 102d includes cellular components for communicating with server 104 via a cellular network. In one embodiment, transceiver 102d includes wired or wireless (e.g., Wi-Fi) components for communicating with server 104 over the Internet or other network. Wireless transceiver 102e is configured to communicate with product 106. In one embodiment, wireless transceiver 102e includes Bluetooth components for establishing a Bluetooth connection with product 106. User device 102 can manage product 106 through the use of a management application that is configured to run on the user device (e.g., via processor 102a and memory 102b). For example, an app may be installed on a mobile phone (i.e., in the memory 102b of user device 102), and the app may be used to configure and control an electronic locking device (i.e., product 106) over a wireless connection (via wireless transceiver 102e). One or more user input devices 102f (e.g., touch screens, buttons, speakers, displays, keyboards, etc.) may be included in user device 102 to allow a user to interact with device 102, server 104, product 106, and any applications running on the device.

In an embodiment where product 106 is a locking device, such an electronic locking device typically includes a processor 106a for providing logic of the electronic locking device and a high current load (e.g., a motorized locking mechanism 106g that may be controlled by the processor). The high current load may include one or more lock mechanisms 106g (e.g., shackles, pins, memories, etc.) as discussed below. The electronic locking device may also include a battery 106d for powering the high current load and a capacitor in parallel with the processor. The electronic locking device may include one or more physical and/or digital interfaces 106e to allow a user to manage the device (e.g., keypad, touch screen, touch sensitive area, dial, combination lock interface, button, keyhole, etc.) A circuit (e.g., processor 106a) of the electronic padlock may be configured to cause the processor to be powered by the capacitor (and in some embodiments not the battery) while the battery 106d is driving the high current load 106g. In one embodiment, the circuit also includes a timer 106c that is configured to maintain a time value the product, which may be used in secured communications as discussed herein. In one embodiment, the electronic locking device includes a location determination circuit 106h, such as a GPS receiver, that may be used to provide a location of the electronic locking device. In various implementations, location determination circuit 106h may be part of or separate from wireless transceiver 106f. In one embodiment, the electronic locking device is an electronic padlock, such as an electronic combination or keypad padlock. In other embodiments, the electronic locking device may be or include, without limitation, devices such as an electronic door lock or keypad device (e.g., a keypad deadbolt), an electronic safe (e.g., a small document safe, an electronic key safe, etc.), an electronic rim or mortise lock or other type of cabinet lock, an electronic auto accessory lock (e.g., a coupler lock, a hitch pin lock, a trailer lock, etc.) and/or a steering wheel or door lock for an automobile, a vehicle lock (e.g., a wheel lock or ignition lock) for other motorized or non-motorized vehicles such as a bicycle, a motorcycle, a scooter, an ATV, and/or a snowmobile, a storage chest, a case with an electronic lock (e.g., a document case or a case for small valuables), an electronic cable lock (e.g., a cable lock enabled with an alarm, such as for securing a computing device), a safety lockout/tagout device for securing access for safety purposes (e.g., for securing an electrical control box while electrical work is being performed), a locker with an electronic lock, and/or an electronic luggage lock. In one embodiment, the locking device is configured to provide access to secured data (e.g., stored in a memory, etc.) or to store secured data. For example, rather than containing physical locking components (or in addition to physical locking components), lock mechanisms 106g may include a secured memory (e.g., memory 106b may include an encrypted hard drive, etc.). Such a locking device may communicate (e.g., via wireless transceiver 106f) based on the authentication techniques discussed herein. For example, upon authentication, the locking device may use its stored secret key to decrypt secured content that is stored in memory 106b. Decrypted content may then be provided to another device (e.g., via wireless transceiver 106f). In one embodiment, the electronic locking device includes touch detection devices and/or proximity detection devices configured to detect the presence of a user (e.g., based on a user's touch, based on motion of a user, etc.).

Figure 1B:
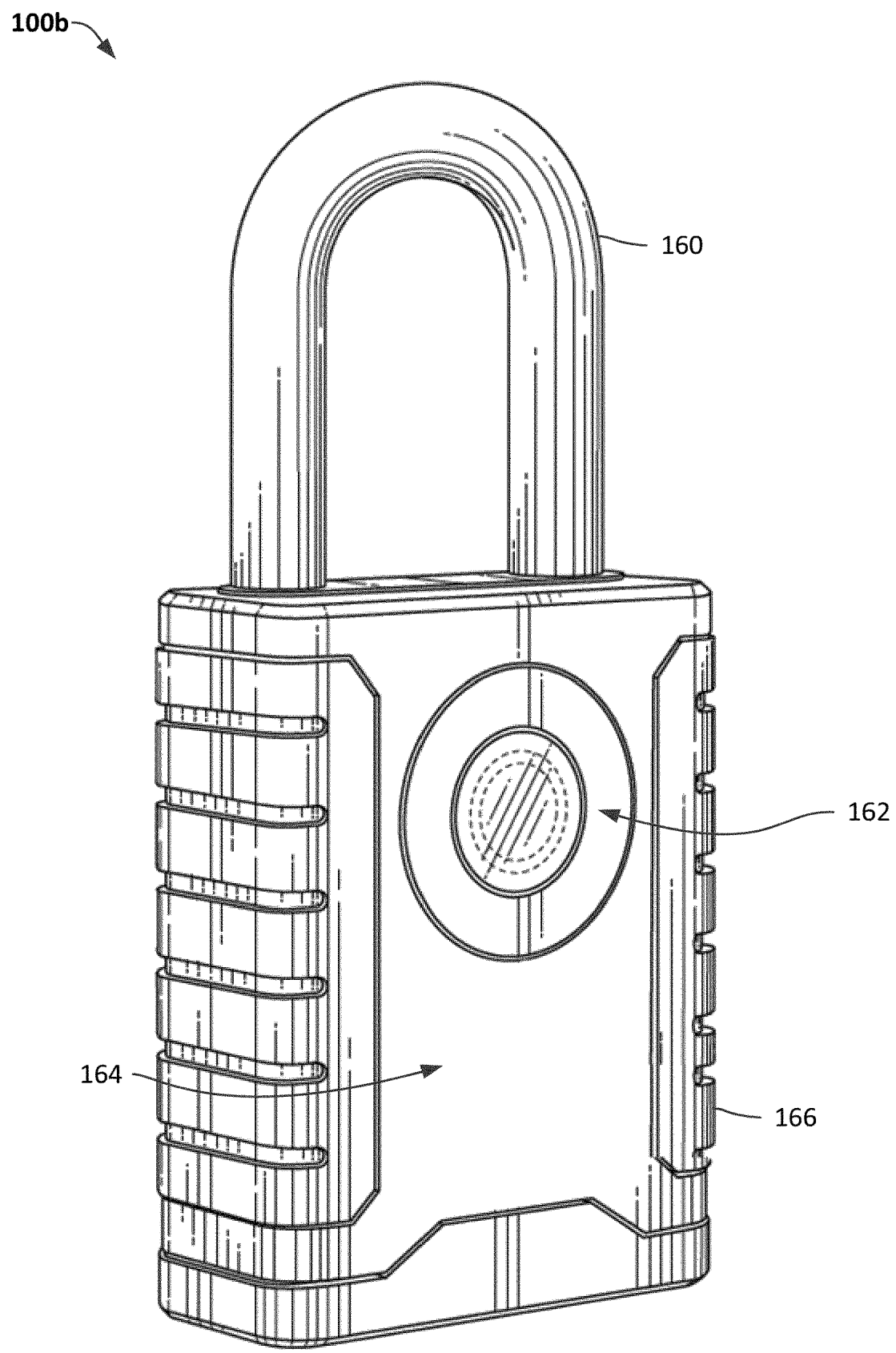
FIG. 1B is a diagram of an example electronic locking device, according to an embodiment.

Referring to FIG. 1B, an example of an electronic locking device 100b is showing, according to one embodiment. Electronic locking device 100b typically includes one or more lock mechanisms (e.g., lock mechanisms 106f). For example, electronic locking device may include shackle 160 an interface 162. In one embodiment, interface 162 includes a touch sensor configured to awake the electronic locking device 100b in response to a user's touch, as is discussed further herein. In one embodiment, interface 162 includes a proximity sensor configured to awake the electronic locking device 100b in response to detecting a nearby user, as is discussed further herein. In one embodiment, interface 162 includes a mechanical dial configured to allow a user to enter a code to the lock (e.g., to unlock shackle 160, etc.). Various processing and mechanical components 164 may be embedded within the case 166 of electronic locking device 100b. For example, the processing and mechanical components 164 may include one or more of the components (e.g., processor 106a, memory 106b, timer 106c, battery 106d, wireless transceiver 106f, lock mechanisms 106g, etc.) discussed with references to product 106 of FIG. 1.

Referring again to FIG. 1, in an illustrative embodiment, product 106 includes a wireless transceiver 106f for communications according to one or more wireless technologies (e.g., radiofrequency, radio frequency identification (RFID), Wi-Fi, Bluetooth, ZigBee, near field communication (NFC), etc.). For example, wireless transceiver 106g may be a Bluetooth transceiver configured to establish a Bluetooth-based connection with user device 102 (e.g., via wireless transceiver 102f). Accordingly, the electronic locking devices discussed herein may be equipped to be locked or unlocked using another user interface device (e.g., user input devices 102f of user device 102, network interface 104e of server 104, etc.), via a wireless transceiver, other than a combination input or keypad input on the lock. For example, wireless communications may be used to lock/unlock/control the electronic locking device wirelessly (e.g., an application on a mobile phone may be used to lock or unlock the device). In one embodiment, the circuit of product 106 also includes an input/output port (e.g., a USB port, a COM port, a networking port, etc.) that may be used to establish a physical connection to another device. For example, such a physical connection may be used by a manufacturer to program or otherwise communicate with product 106.

Server 104 generally includes components (e.g., a processor 104a, memory 104b, network interface 104e, etc.) to communicate with user device 102 and provide authentication keys and encryption functions. Communications between server 104 and user device 102 may be direct or via an intermediate network (e.g., an internet network, a cellular network, etc.). For example, networking interface 104e may include physical network components (e.g., a network card, etc.) configured to allow server 104 to establish a connection to transceiver 102d of device 102. In one embodiment, communications from network interface 104e are routed through a cellular interface, allowing server 104 to communicate with device 102 via a cellular network. In one embodiment, network interface 104e allows server 104 to establish an Internet-based connection with device 102. Server 104 may be one server (a physical or virtual server), or may include multiple servers. Server 104 may include one or more services configured to generate and store keys (e.g., secret key, access key, etc.) used for authentication and encryption. In one embodiment, various modules of memory 104*b* provide different functions of server 104. For example, a device interface module 104*c* may be used to establish and manage communications with user device 102. A security module 104*d* may be used for security related functionality (e.g., generating and storing keys, encrypting a user profile, etc.). The output of security module 104*d* may be provided to device interface module 104*c*, such that device interface module may then communicate the security related data to device 102. In one embodiment, an access key and an encrypted user profile may be provided by security module 104*d* at the request of device interface module 104*c*. Upon receiving the access key and encrypted user profile, device interface module 104*c* may transmit (e.g., via a cellular network through network interface 104*e*) the access key and encrypted user profile to user device 102. In this manner, user device 102 does not directly access security module 104*d*. In one embodiment, device interface module 104*c* and security module 104*d* are located on two separate servers 104.

The following discussion describes embodiments having an electronic locking device (i.e., product 106) and a mobile device (i.e., user device 102). When the lock is manufactured, or soon thereafter, two keys (secret key and access key) can be generated and affiliated with the lock. For example, the secret key and access key may each be related to a unique serial ID or other identification number for the lock, and may be stored in a memory of the lock. In one embodiment, one or both keys are unique and/or randomly generated keys. In one embodiment, a unique code that represents the product is generated (e.g., by server 104) and this unique code can be used to link the lock to its corresponding keys. For example, such a unique code may be secured in product packaging of the lock so that a user may appropriately configure the lock and mobile device. In one embodiment, a separate unique code is provided for each of the security and access keys, and each unique code may be associated with their respective security or access key by the manufacturer. In one embodiment, server 104 also generates the secret and access keys. For example, server 104 may provide a key generation service that may be accessed during the manufacturing process. The keys may be generated according to any generation algorithm; however, the secret key and access key are typically not derived from one another. After generation, the secret is key is only stored on server 104 and the lock. The secret key is not transmitted to the mobile device. However, the access key may be provided to both the lock and the mobile device.

Figure 2:
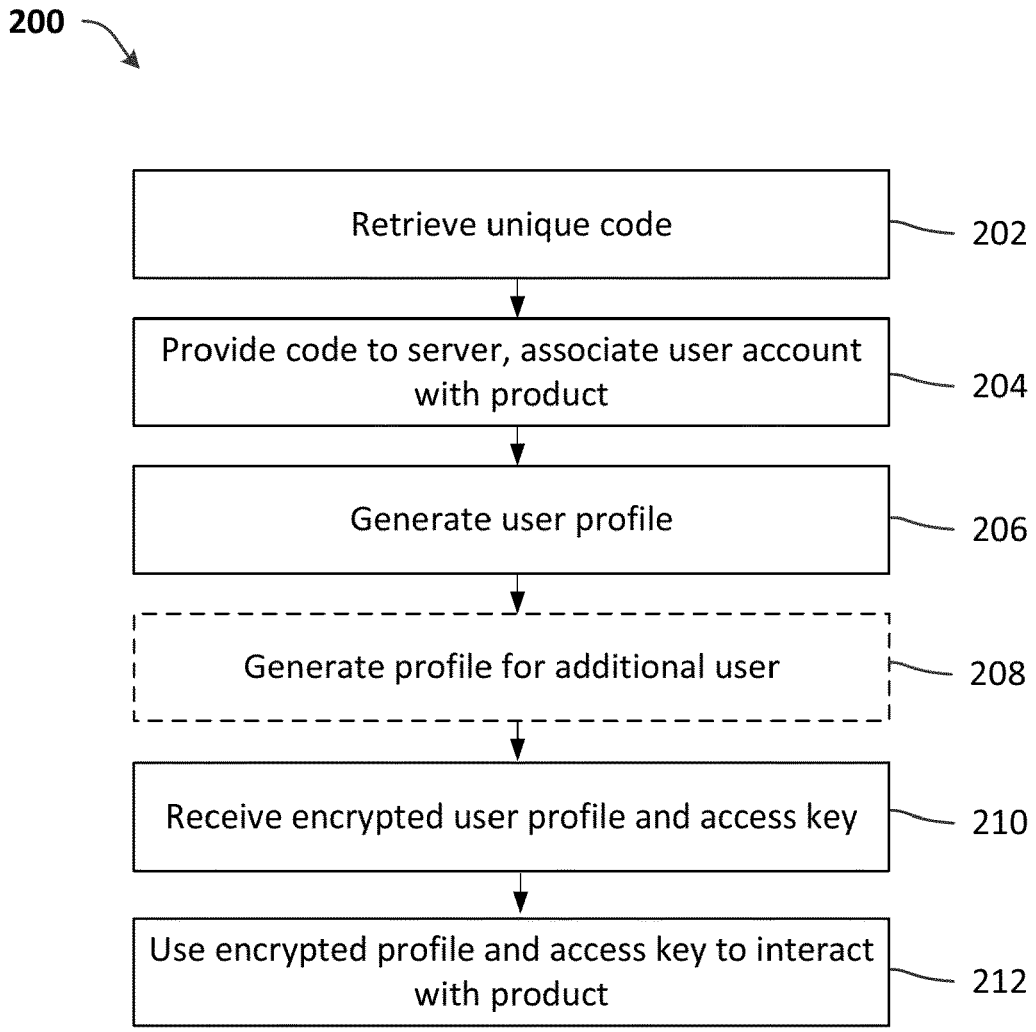
FIG. 2 is a flow diagram of a process for configuring a product and user device, according to an embodiment.

When a user acquires a lock, the user may configure both the lock and the user's mobile device using the unique code that is used to link the lock to its keys. Referring to FIG. 2, a flow diagram of an illustrative process 200 for configuring a product and user device is shown, according to an embodiment. In alternative embodiments, fewer, additional, and/or different steps may be performed. Also, the use of a flow diagram is not meant to be limiting with respect to the order of steps performed.

The unique code is retrieved (202). For example, the user may refer to included product packaging to retrieve the unique code, or the user may otherwise contact a manufacturer to receive the unique code (e.g., via a manufacturer website, phone, etc.). The unique code is then provided to the management server (204) in order to associate the lock with the user. For example, a user may enter the unique code on a user interface of an application running on the mobile device, which then transmits the unique code to the server. In one such example, the user may enter the unique code within a frontend interface provided by the management server and accessed via a browser application on the mobile device. Alternatively, the user may use the mobile device to scan packaging of lock to retrieve and transmit the unique code. For example, the unique code may be encoded by a barcode, QR code, optical code, etc., and a camera of the mobile device may be used to scan and determine the unique code. In response to receiving the unique code from the mobile device, the server can retrieve or newly generate (e.g., on demand) the secret key and access key, which may then be associated with the unique code.

The server may then generate a user profile (206), which may also be associated with the unique code. If a user profile does not yet exist, default values, or values provided by the user via the mobile device may be used to generate the new profile. For example, the user may enter profile data into an application of the mobile device, which transmits the profile data to the server along with the unique code. If the user has already created a profile, the server may instead update the user profile with new values provided by the user via the mobile device.

In general, a user profile may include one or more files that include data related to operation of the product, which is the lock in the above embodiment. For example, a user profile may contain a user schedule of when the lock may be accessed (unlocked, locked, etc.). The schedule may specify lock access permissions, e.g., by day of the week, including starting times (hours, minutes, etc.) and ending times (hours, minutes, etc.) for each corresponding permission. For example, a schedule may specify the time spans in which an electronic lock may be unlocked via the mobile device. As another example, the schedule may specify time periods in which typical interactions are expected to occur, and a level of trust may be determined based on these time periods. Accordingly, an unlock request sent within an expected time period may be more trusted by the lock than a request sent at an unexpected/atypical time. The mobile device may also automatically adjust a schedule. For example, the mobile device may log/record a user's interactions with the lock, and may set a schedule based around the user's anticipated actions. In one embodiment, a default user schedule is set (e.g., by the manufacturer, etc.). Additionally, a list of typical user schedules may also be provided to allow a user to select from one of many configuration options. In this manner, a manufacturer may provide various recommended operational settings to a user. A user may also customize a schedule to tailor the schedule as he or she desires.

A user profile may further specify a model/serial number of the lock and what types of accesses are available for that user. For example, such accesses may include: reading software/hardware version information of the lock, updating software of the lock, reading a shackle state of the lock, locking, unlocking, disarming, reading/setting a time/clock value, reading a battery level, reading/clearing event related data (e.g., flags, counters, etc.), reading a log of the lock, reading/setting/resetting a keypad code of the lock, reading communications data for the lock (e.g., transmission statuses, transmission power levels, channel information, addressing information, etc.), reading/setting default values stored for the lock (e.g., default disarm times, default unlock times, etc.), among others. A user profile may also specify a start time and a revocation date/time for the profile (i.e., when the profile begins to be valid and when the profile expires and is no longer valid). A user profile may provide maximum disarm/unlock times for the lock. A user profile may also provide an indication of a trust level of a corresponding mobile device (e.g., whether a time value/timestamp provided by the mobile device is trusted or not). The lock may be configured to allow or disallow certain functionality based on the trust level of a device. The trust level may be stored as an independent permission that the user may or may not have access to (e.g., the trust level may be managed/adjusted by the software of the lock, mobile device, or server, etc.). As an example, only a highly trusted device may be able to upgrade the firmware of the lock or change certain settings. Additionally, the lock may have a security algorithm that factors in a trust level and time value. For example, as a device successfully interacts with the lock more often, the lock may increase (or adjust) a trust level for the device. However, if a time value is out of sync with the lock's maintained time or authentication fails, the lock may decrease (or adjust) a trust level for the device. The time value provided by the mobile device may be compared to a time value maintained by the lock, and a degree of closeness between the two times may be used to indicate a trust level for the device (e.g., the closer the two times are to being in sync, the higher the trust level, etc.). If a trust level decreases below a certain threshold, the lock may discontinue or limit interactions with the mobile device. A trust level may also be based on the schedule discussed above. For example, a mobile device may be regarded as more or less trusted based on the time the device is accessing the lock, and whether that time falls within certain time periods as defined by the schedule. The time value provided by the mobile device may also be used to sync the clock of the lock with that of the mobile device, or may be used otherwise during authenticated communications. Any of the profile items discussed may have default values (e.g., manufacturer defaults) or user provided values. A profile is not limited to the above data, and additional data may be included. A profile may also be stored on a server for later retrieval.

In addition to generating a profile for the user (e.g., the owner of the lock), the user may desire to create additional guest profiles (208) to be shared with friends, family, co-workers, etc. In this manner, a user may grant another person access to the lock, based on the guest profiles. To do so, a user may enter in desired profile values (using the mobile device) for the additional person(s). Similar to the creation of the user's profile, the guest profile data may be transmitted to the server to be processed as discussed further below. The guest profile data may be transmitted to the server simultaneously or separately (e.g., at a later time) from when the user initially generates his or her profile. The mobile device includes information that differentiates the types of profiles (e.g., owner vs. guest) being provided to the server.

After at least one profile is generated, the user is associated with the particular lock as an owner of the lock. In some embodiments, the association may be based solely on the unique code that was provided to the server (e.g., in step 204). In one embodiment, after providing a unique code, the mobile device may use the unique code to automatically retrieve additional information related to the lock (e.g., a serial ID, a model number, etc.) from a database or a server of the lock's manufacturer. In alternative embodiments, a serial ID, a model number, or other code may also be provided by a user (e.g., by referring to product packaging, etc.), and such additional data may be utilized, along with the unique code, in associating a user with a lock. In some embodiments, additional authentication of a user may also be required prior to associating a user with a lock as an owner, and such authentication may be provided via the mobile device.

The management server then may verify received profile data. To verify the received profile data, the management server may perform a cyclic redundancy check (CRC) on the profile to ensure the data's integrity. Other data verification methods may also be utilized. For example, in an illustrative embodiment, a message authentication code (MAC) (e.g., a keyed-hash message authentication code (HMAC)) may be generated using the secret key and used for verification of data integrity. The scope of the present disclosed is not limited to a certain data integrity validation mechanism. The sever can then encrypt the profile data using the secret key in order to transform the profile data into an encrypted profile (e.g., ciphertext). The profile may be encrypted according to any known encryption standards. In an illustrative embodiment, the profile is encrypted using CCM mode (NIST/FIPS counter mode encryption with cipher block chaining MAC) based algorithms, and the secret key, which is used as the cipher key, has a length of 128 bits. Accordingly, the server may encrypt the user profile and also generate a MAC using the secret key. Alternatively, other standards could also be used, such as performing encryption and generating a MAC with different keys.

In one embodiment, the management server discussed herein is one of a group of management servers. In such an embodiment, a first management server may be configured to handle communications with mobile devices, and a second management server may be configured to handle security functionality (e.g., storage of keys, generation of keys, encryption/decryption processes, etc.). In this manner, the first server may receive communications from a mobile device and may communicate with the second server when security functions are required. For example, the first server may request a service provided by the second server to encrypt profile data that was initially received by the first server. The second sever may then encrypt and provide the encrypted data to the first server, which may then transmit the encrypted data to the mobile device. Other server configurations are also envisioned.

After encryption, the encrypted profile is transmitted from a server to the mobile device (210). The server also transmits the corresponding access key to the mobile device (210). In an illustrative embodiment, the access key has a length of 128 bits. The access key can be determined by the server using the unique code (e.g., as discussed in steps 202-204). The received encrypted profile and access key are then stored in a memory of the mobile device in order to complete the association of the mobile device with the lock. The user may then use his or her mobile device to interact with the lock (212).

In the scenario that a guest profile was generated, in some embodiments, the server may perform similar security procedures as performed for the user profile. For example, the guest profile may be stored and encrypted using the secret key. In some embodiments, in the case of a guest profile, the server may first transmit a notification to the guest prior to encrypting and transmitting the encrypted guest profile. For example, the server may send a notification email or text/SMS message/alert to the guest based on information that the user provided (e.g., an email address, phone number, etc.) when the user set up the guest profile. Upon reception of a notification, a guest may then activate his or her profile that was created by the user. For example, the notification may include an activation link to be clicked (e.g., within the email or message) or code that the guest is required to provide. The guest may also install the management application discussed herein and use the application to activate the guest profile using an activation code. Upon activation and installation of the management application, the server can then generate and transmit the encrypted guest profile and access key to a mobile device of the guest via the management application. After receiving the encrypted guest profile and access key, each may be stored in the guest's mobile device to associate the guest's device with the lock. The guest may then use his or her mobile device to interact with the lock (212).

After a profile is configured, the user (or guest) may interact with the lock wirelessly via the mobile device. For example, a user may lock, unlock, or adjust settings of the lock, etc. In one embodiment, the lock may wake up/detect the presence of a nearby user and begin an interaction process. For example, the lock may include proximity detection features, or the user may actively touch the lock (e.g., a touch sensitive location on the lock, a physical button, etc.), or the user's mobile device may transmit a signal on a common channel in order to wake up the lock, etc. When the lock has been woken up, it can attempt to connect with the mobile device of the user. For example, the lock may broadcast its model and serial number information (or other unique lock ID information) and wait for a response from the mobile device. The mobile device can receive the lock information and compare it to the profiles maintained by the management application. For example, the management application can maintain profiles for multiple different locks at a time. If a match is found (e.g., if a profile is found for that particular type of lock), an authentication procedure may commence to verify the matched profile. If the profile is verified, and the user has access at that particular time (i.e., based on scheduling data of the profile), and the user's time/device is trusted, the user may unlock the lock and perform other interactions with the lock. After authentication, the lock's time and mobile device's time may also be synced, if necessary.

Figure 3:
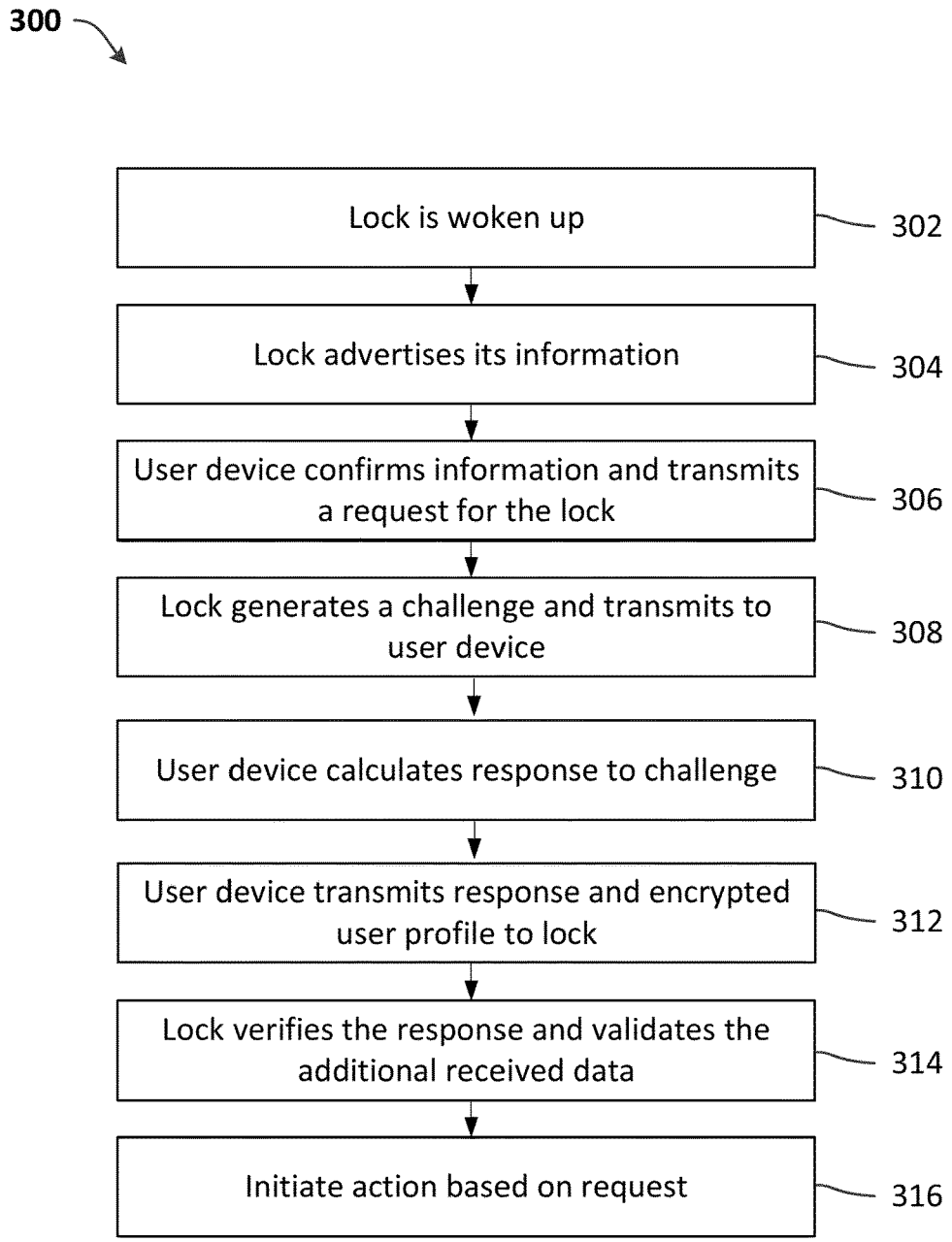
FIG. 3 is a flow diagram of a process for interacting with a product with a user device, according to an embodiment.

Referring to FIG. 3, a flow diagram 300 of an illustrative process for interacting with a product with a user device is shown, according to an embodiment. In alternative embodiments, fewer, additional, and/or different steps may be performed. Also, the use of a flow diagram is not meant to be limiting with respect to the order of steps performed.

In some embodiments, the lock may be woken up out of a low power standby or sleep state (302). For example, the lock may be touched by a user, or the proximity of the user may be automatically detected. The standby/sleep state may utilize less power (e.g., battery power) than if the lock is in a fully operational, awake state. In some embodiments, the lock may always be in a fully functional state, and may not be woken up out of a standby/sleep state.

The lock may advertise its type information (304), for example, by broadcasting a unique ID (e.g., an identifier that is formed from its model and/or serial number). The communications between the lock and device may be over any type of wireless communications protocol. In one embodiment, the mobile device and lock communicate via a Bluetooth connection. In another embodiment, the mobile device and lock communicate via a Wi-Fi connection. In another embodiment, the mobile device and lock communicate via a ZigBee connection. In another embodiment, the mobile device and lock communicate via an NFC connection. Additionally, any of the data communicated (e.g., the packets transmitted) between the mobile device and the lock may be further secured according to any known security protocol (e.g., WEP, WPA, user/manufacturer passwords, etc.). In one embodiment, data transmitted between the mobile device and lock is encrypted using the access key. In this embodiment, both the mobile device and lock are able to encrypt and decrypt data, as each has a stored copy of the access key. Upon decrypting a received data, both the mobile device and lock may further ensure the integrity of the decrypted data, for example, by using a MAC validation scheme, running a CRC check, etc., on the decrypted data. Such a MAC validation scheme also allows the mobile device and lock to verify that the data originated from its proper source (i.e., the other holder of the key used to generate the MAC, etc.).

The user device receives and confirms the lock's information (e.g., the lock's ID) (306). In one embodiment, the lock's ID is compared to a list of profiles stored on the mobile device to determine whether the mobile device is associated with the lock (e.g., whether a profile exists that corresponds to the lock's ID). If a matching profile is not found, a user may be prompted to create a profile (e.g., via process 200) using the unique code that links the lock to the secret key. If a profile is found for the lock, the user device may then transmit a request to the lock (e.g., an unlock request, etc.), and an authentication procedure can commence prior to complying with the request.

The lock generates a challenge and transmits the challenge to the user device (308). In one embodiment, the lock generates a long random number as the challenge. In another embodiment, the lock generates data that varies by communication session (e.g., a unique number (a session identifier) may be generated as the challenge for each communication session). In one embodiment, the challenge is transmitted as plaintext to the mobile device; however, in another embodiment the challenge may be encrypted using the access key. The mobile device calculates the response (e.g., a long response) for the challenge using a security algorithm and the access key (which was received from the server during configuration as discussed above) (310). In one embodiment, the mobile device uses the access key to generate the response and a MAC that is transmitted with the response. In some embodiments, the communications between the mobile device and lock are secured further based on sequential identification (e.g., sequential identification of packets or messages). For example, with sequential identification, the mobile device may transmit a field that should follow a particular sequence for each received packet. The lock may then verify the received packets against a known sequence. Such a known sequence may be predetermined or generated by the lock, and also may be provided to the mobile device by the lock during communications. Accordingly, this sequencing may be used along with one or more of the other methods described above (e.g., a session identifier may be used along with a predetermined initial sequence field value), or sequencing may be used by itself (e.g., the lock may provide the initial value of the sequence field upon connection). In one embodiment, upon connection, the mobile device receives an initial sequence number from the lock, and the lock verifies that subsequently received messages contain the initial number incremented once for each message received. The lock may further verify that the received messages are encrypted using the access key and/or include a MAC computed therefrom.

The mobile device can then transmit to the lock the response and the corresponding encrypted profile (which was encrypted by the server using the secret key as discussed above) (312). In one embodiment, the mobile device also transmits a current timestamp based on the mobile device's clock. As the lock stores both the secret key and access key, it may use these keys to authenticate the data received from the mobile device. In one embodiment, the lock uses the access key to verify that the response to the challenge is correct and to verify the MAC (314). In one embodiment, the lock requires the response to be verified prior to then accepting and attempting to decrypt the profile. Upon successful completion of the challenge-response process, the lock can validate the received data (314). The lock can use the secret key to decrypt the encrypted profile, and the lock may also validate the data (e.g., using the MAC generated from the secret key or other validation scheme, e.g., performing a CRC check) of the decrypted profile data to ensure that the decryption was successful and that the data in fact came from the correct source (e.g., that the encrypted profile was generated by the server, etc.). The lock may also ensure that the profile has access at that verified time (e.g., by referring to the scheduling information included in the decrypted profile). In an embodiment where the mobile device transmitted a timestamp, the lock may verify the timestamp by comparing the timestamp with a current time of the lock. If the response and decrypted profile are each verified, then the lock may comply with the request of the mobile device and initiate a corresponding action (316). In an embodiment utilizing the timestamp discussed above, a received timestamp may also be required to be within a threshold amount of time from a time maintained by the lock. In this example, the lock can unlock its shackle as requested.

In another embodiment where the lock is configured as a digital locking device (e.g., to store secured data in its memory), the lock may use its copy of the secret key to decrypt content that is stored in the lock. Accordingly, if a request is received from a mobile device to retrieve or store certain data such a locking device, a transfer of such data may be initiated in response to the request. For example, if a mobile device requests to store data, and the corresponding encrypted profile that was provided during authentication allows such an action, and authentication as discussed above was successful, the mobile device may proceed to transmit data (and the locking device may receive such data) to the locking device. The locking device may then store the received data in its memory. If the received data is not yet encrypted, the locking device may use its secret key to encrypt the data to be stored. As another example, if a mobile device requests to retrieve data, and the corresponding encrypted profile that was provided during authentication allows such an action, and authentication as discussed above was successful, the lock may decrypt and transmit requested data to the mobile device. Alternatively, the lock may transmit encrypted data, and the mobile device may then communicate with the server (which also stores a copy of the secret key) for decryption purposes. Any typical data interactions (e.g., deleting data, renaming files, copying data, organizing data, etc.) may also be supported by the digital locking device, which may be based on the types of accesses specified in the corresponding user profile.

Additional security related features may also be implemented by the server discussed herein. For example, in the instance an access key or secret key is compromised, an operator of the server or the user (via the mobile application) may initiate a protective measure. For example, the user may request a new key pair to be generated. In one embodiment, the server can generate a new key pair consisting of a newly generated secret key and the old access key, and encrypt the new key pair using the old secret key (similar to the encryption of a profile as discussed above). The server may then communicate with the mobile device to queue a key pair change request. If a user has multiple devices, or guest profiles, the user may select one or more particular devices on which the key pair change request is queued. Upon the next access attempt by the mobile device with the lock, a challenge-response sequence as discussed above may be initiated; however, the requested action can be a "key change request." As part of the challenge response transmission, the mobile device may include the encrypted new key pair. For example, the mobile device may transmit the response, and then the encrypted new key pair. Upon validation of the response, the lock may decrypt the encrypted new key pair using the old secret key and verify the data. If successful, the lock may access the new secret key from the decrypted new key pair, and then store the new secret key to be used in future interactions. In addition to updating the secret key, other functionality may be provided through similar challenge-response exchanges and encryption using the secret key. In one embodiment, instead of transmitting a "key change request," the mobile device may transmit a "firmware update request" along with new firmware version that is encrypted with the secret key. Upon successful authentication, the lock may proceed to decrypted the new firmware, and then update its firmware to the new version.

Any of the devices discussed herein (e.g., user device, product, server) may also be configured to generate an audit trail related to its operations. For example, a log may be formed to detail the events that occur throughout the interaction of a user device and a product. This may include server-to-user device events (e.g., sending an encrypted profile, sending a new key pair request, etc.), user device-to-product events (e.g., sending/responding to an unlock request, logging when authentication succeeds and fails, etc.), device-only events (e.g., logging application errors, logging shackle status of an electronic locking device, etc.), among others. The scope of the present disclosure not limited to a particular log formatting.

In one embodiment, the lock is additionally equipped with a location determination circuit, such as a GPS device/receiver, and may transmit its location information (e.g., GPS coordinates) to the mobile device during interactions with the mobile device. The location information may then be stored by the mobile device (e.g., within the profile created for the lock, etc.) as a last known location of the lock. The mobile device's management application can also be equipped with mapping functionality so that the last known location of the lock may be displayed on a map, based on the provided location information. Alternatively, the management application may allow the location information to be exported to a third party mapping application. These location features can allow a user to open the management application on his or her mobile device, and then view a map that indicates where the lock was located when the last known location (e.g., GPS coordinates) was provided. Additionally, navigational directions or other features may be provided to guide a user to the lock. In an alternative embodiment, the mobile device may also include a GPS device. In this manner the mobile device may also record its location information during interactions with the lock and server.

Figure 4:
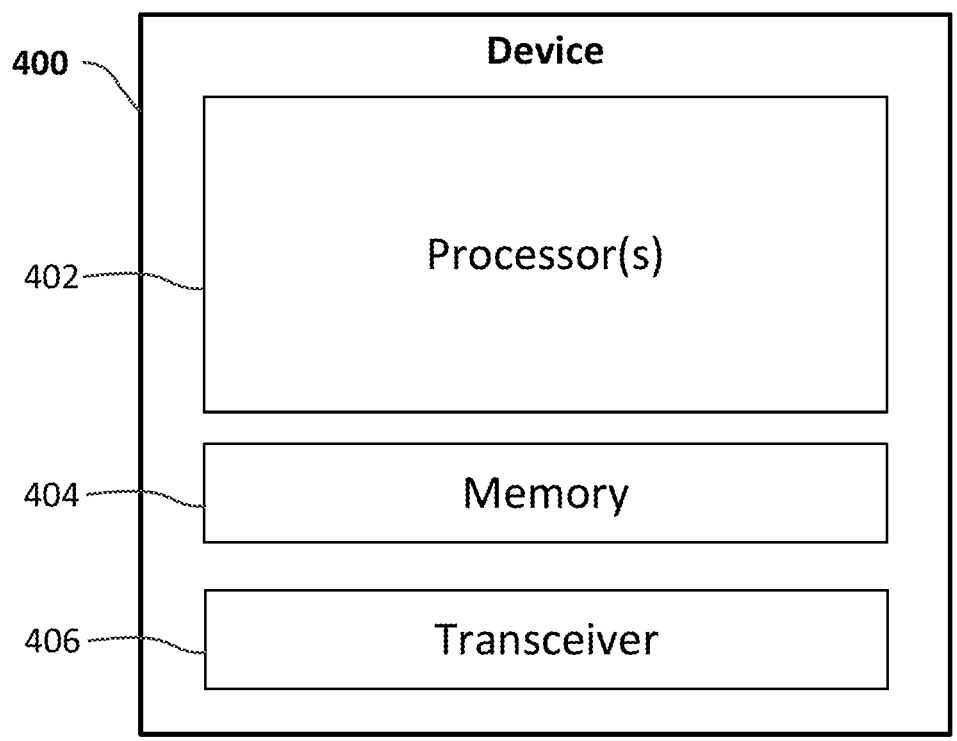
FIG. 4 is a block diagram of a device for implementing the techniques disclosed herein, according to one embodiment.

In any of the embodiments discussed herein, the devices may form a portion of a processing subsystem including one or more computing devices having memory, processing, and communication hardware. The devices (e.g., servers, user devices, products) may be a single device or a distributed device, and the functions of the devices may be performed by hardware and/or as computer instructions on a non-transient computer readable storage medium, and functions may be distributed across various hardware or computer based components. Referring to FIG. 4, a device 400 is shown, which may represent any of the devices discussed herein. Device 400 may also be used to implement the techniques and methods discussed herein. For example, device 400 may comprise the processing components of user device 102 (e.g., the processing components of a mobile phone). As another example, device 400 may comprise the processing components of server 104. As another example, device 400 may comprise the processing components of product 106 (e.g., the processing components of an electronic locking device). In addition, device 400 may be configured to perform the computations discussed herein (e.g., the computations related to processes 200 and 300, etc.) and generate the signals necessary to communicate with other devices, encrypt and decrypt data, authenticate data, etc., in order to implement the techniques of this disclosure.

Device 400 typically includes at least one processor 402 coupled to a memory 404. Processor 402 may be any commercially available CPU. Processor 402 may represent one or more processors and may be implemented as a general-purpose processor, an application specific integrated circuit (ASIC), one or more field programmable gate arrays (FPGAs), a digital-signal-processor (DSP), a group of processing components, or other suitable electronic processing components. Memory 404 may include random access memory (RAM) devices comprising a main storage of the device 400, as well as any supplemental levels of memory, e.g., cache memories, non-volatile or back-up memories (e.g., programmable or flash memories), read-only memories, etc. In addition, memory 404 may include memory storage physically located elsewhere, e.g., any cache memory in the processor 402 as well as any storage capacity used as a virtual memory, e.g., as stored on a mass storage device, etc. Device 400 also includes transceiver 406, which includes any additional networking components or transmitters necessary to communicate with other devices (e.g., Wi-Fi networking components, Bluetooth components, ZigBee components, NFC components, etc.). For example, in an embodiment where device 400 comprises an electronic lock, transceiver 406 may be a Bluetooth transceiver configured to communicate with a user's mobile device. As another example, in an embodiment where device 400 comprises a server, transceiver 406 may be a networking interface configured to couple the server to a network to communicate with a mobile device. As another example, in an embodiment where device 400 comprises a mobile device, transceiver 406 may include a Wi-Fi or cellular transceiver configured to communicate with a server, and transceiver 406 may further include Bluetooth components configured to communicate with a product (e.g., an electronic locking device).

In general, the routines executed to implement the embodiments may be implemented as part of an operating system or a specific application, module, or sequence of instructions. In certain embodiments, device 400 includes one or more modules structured to functionally execute the respective operations necessary for wireless key management for authentication as described herein. The description herein including modules emphasizes the structural independence of the aspects of a device and illustrates one grouping of operations and responsibilities of a device. More specific descriptions of certain embodiments of a device's operations are described by the sections herein referencing FIGS. 1-3. Other groupings that execute similar overall operations are understood within the scope of the present application. The modules typically comprise one or more instructions set at various times in various memory and storage devices in a computer, and that, when read and executed by one or more processors in a computer, cause the computer to perform operations necessary to execute elements of disclosed embodiments. Moreover, various embodiments have been described in the context of fully functioning computers and computer systems, those skilled in the art will appreciate that the various embodiments are capable of being distributed as a program product in a variety of forms, and that this applies equally regardless of the particular type of computer-readable media used to actually effect the distribution.

Figure 5:
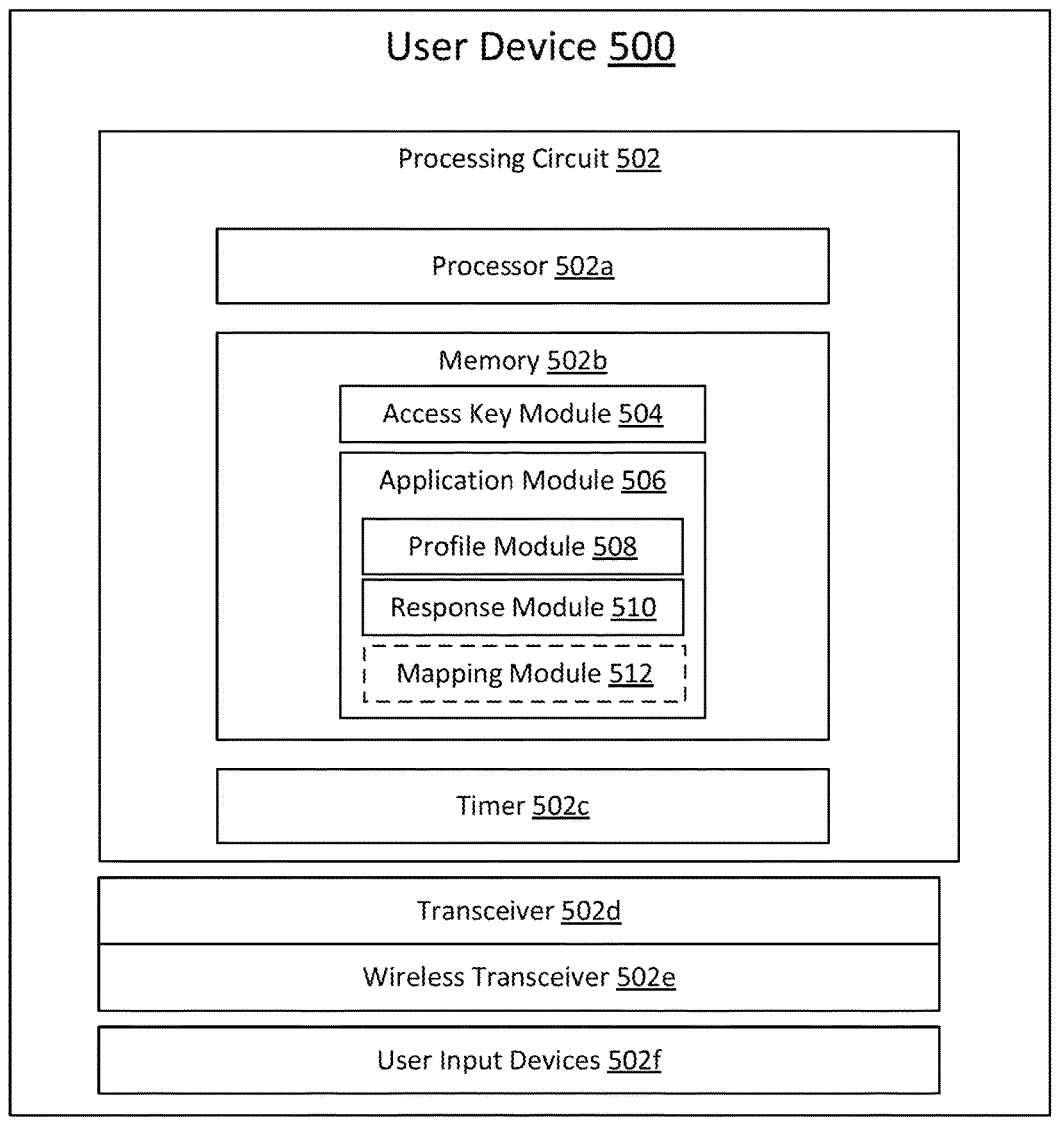
FIG. 5 is a block diagram of a user device for implementing the techniques disclosed herein, according to one embodiment.

Referring to FIG. 5 a block diagram of a user device 500 for implementing the techniques disclosed herein is shown, according to one embodiment. For example, user device 500 may correspond to the mobile devices discussed herein. In one embodiment, user device 500 is a mobile phone. In another embodiment, user device 500 is a laptop computer. In another embodiment, user device 500 is a tablet computer. In another embodiment, user device 500 is a desktop computer. In general, user device 500 includes a processing circuit 502, which may include a processor 502*a*, a memory 502*b*, and a timer 502*c*. Processor 502*a* may be any commercially available processor or any of the processors discussed herein (e.g., processor(s) 402, etc.). Memory 502*b* includes any of the memory and/or storage components discussed herein. For example, memory 502*b* may include RAM and/or cache of processor 502*a*. Memory 502*b* may also include one or more storage devices (e.g., hard drives, flash drives, computer readable media, etc.) either local or remote to user device 500.

Memory 502*b* includes various software modules configured to implement the techniques disclosed herein with respect to user devices. For example, memory 502*b* includes an access key module 504, which is configured to store and provide the access key as requested by the other modules of memory 502*b*. Application module 506 is configured to provide the management application as discussed herein. For example, in an embodiment where user device 500 is a mobile phone, application module 506 includes the software corresponding to a mobile phone app, which may be used to interface with a server and/or product. Application module 506 may include a profile module 508, which is configured to manage the profile generation process, including interactions with the server and product. For example, a user may interact with user device 500 (e.g., via user input devices 502*f*) through the application provided by application module 506. The user may create one or more profiles corresponding to one or more products, which are transmitted (e.g., via transceiver 502*d*) to a server. The server may encrypt a user profile, and profile the encrypted user profile, access key, MAC, etc., to the user device 500 as discussed herein. Application module may also interact with a product (e.g., an electronic locking device) via wireless transceiver 502*e* as discussed herein. A response module 510 may include the security algorithms required for generation a response to a challenge sent by a product. Additionally, the response module 510 may include encryption/decryption and MAC authentication algorithms, which may be accessed by application module 506 during secured communications. Memory 502*b* may further include a timer 502*c*, which may include the clock components of processor 502*a*, for maintaining a device time to be used as described herein.

In some implementations, memory 502*b* may include a mapping module 512 that may be used to generate one or more mapping interfaces based on location data received from a product (e.g., locking device). One such implementation is described below with respect to FIG. 8.

User device 500 further includes transceiver 502*d* and wireless transceiver 502*e* (which may correspond to transceiver 102*d* and wireless transceiver 102*e* of user device 102, etc.), which include various communication circuitry.

For example, in one embodiment, transceiver 502*d* may include cellular components and/or Wi-Fi components and wireless transceiver 502*e* may include Bluetooth components, etc. User input devices 502*f* may include one or more user input devices for interaction with user device 500. For example, user input devices 502*f* may include one or more buttons, touch screens, displays, speakers, keyboards, stylus inputs, mice, track pads, etc.).

Figure 6:
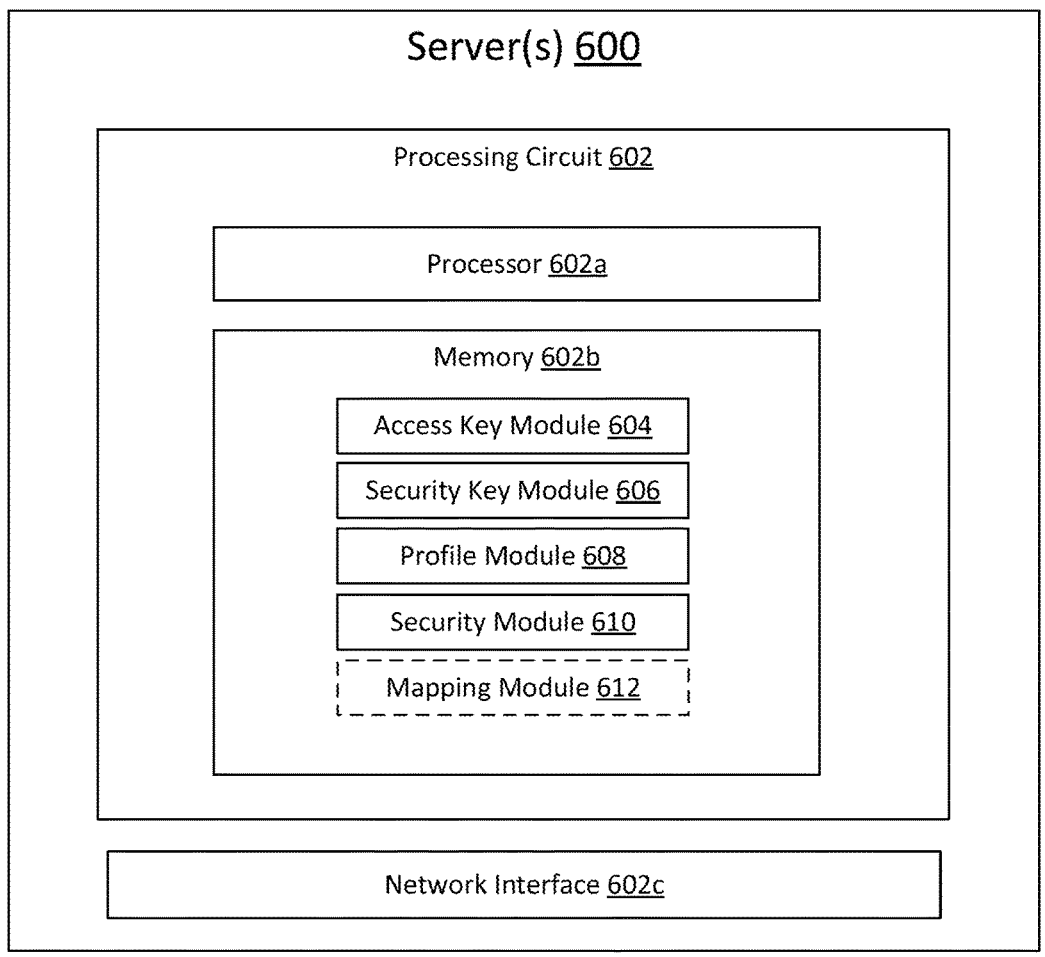
FIG. 6 is a block diagram of a server for implementing the techniques disclosed herein, according to one embodiment.

Referring to FIG. 6 a block diagram of servers 600 for implementing the techniques disclosed herein is shown, according to one embodiment. Servers 600 include one or more physical or virtual servers/server slices, etc. For example, servers 600 may correspond to server(s) 104. In general, servers 600 are configured to interact with a user device (e.g., user device 500, etc.). A server 600 may include a processing circuit 602. Processing circuit 602 includes a processor 602*a* and memory 602*b*. As an example, processor 602*a* may include any commercial available processor, e.g., a server processing chip, a virtual processor, etc. Memory 602*b* includes any of the memory and/or storage components discussed herein. For example, memory 602*b* may include RAM and/or cache of processor 602*a*. Memory 602*b* may also include any mass storage devices (e.g., hard drives, flash drives, computer readable media, etc.).

Memory 602*b* may include an access key module 604 and security key module 606. The access key module 604 and security key module 606 may be configured to securely store access keys and security keys, respectively. The access and security keys may correspond to products as discussed herein. As an example, access key modules 604 and security key module 606 may correspond to databases of keys, and may include the software configured to store and retrieve such keys. Profile module 608 includes the software configured to interact with a product (e.g., to manage the process of user and guest profile generation, storage, and communication with a user device). Profile module 608 may also interact with security module 610, which may include the security algorithms as discussed herein. For example, security module 610 may be configured to generate an access key, a security key, encrypt/decrypt data, generate a MAC based on data, etc., and provide such data to profile module 608. In one embodiment, the security functions of security module 610 and access key module 604 and security module 606 are located on separate servers 600 from profile module 608. In this embodiment, various services may be provided by appropriate servers such that profile module 608 may access security functions and retrieve keys as necessary to implement the techniques discussed herein. In some embodiments, servers 600 are also configured to interact with a product (e.g., product 106). For example, during a manufacturing process, servers 106 may provide an access key and security key to be stored in a corresponding product.

In some implementations, memory 602*b* may include a mapping module 612 that may be used to generate one or more mapping interfaces based on location data received from a product (e.g., locking device). One such implementation is described below with respect to FIG. 8.

Figure 7:
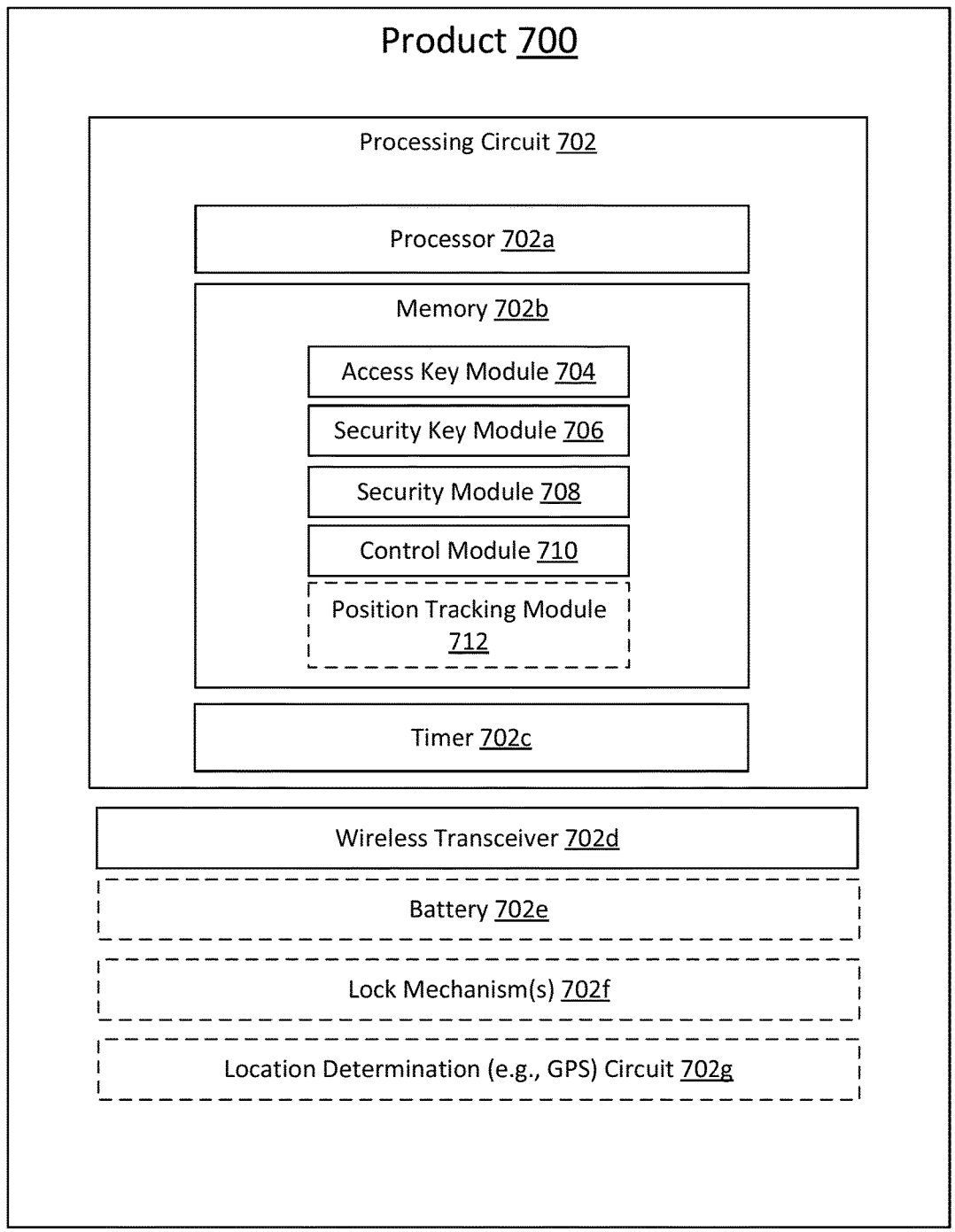
FIG. 7 is a block diagram of a product for implementing the techniques disclosed herein, according to one embodiment.

Referring to FIG. 7 a block diagram of a product 700 for implementing the techniques disclosed herein is shown, according to one embodiment. For example, product 700 may be a lock as discussed herein. In general, product 700 includes a processing circuit 702, which may include a processor 702*a*, a memory 702*b*, and a timer 702*c* (which may include the clock components of processor 702*a*, for maintaining a product time to be used as described herein). Processor 702*a* may be any commercially available processor or any of the processors discussed herein (e.g., processor(s) 402, etc.). Memory 702*b* includes any of the memory and/or storage components discussed herein. For example, memory 702*b* may include RAM and/or cache of processor 702*a*. Memory 702*b* may also include one or more storage devices (e.g., hard drives, flash drives, computer readable media, etc.).

Memory 702*b* includes various software modules configured to implement the techniques disclosed herein with respect to products (e.g., electronic locking devices, etc.). For example memory 702*b* may include an access key module 704, a security key module 706, a security module 708, and a control module 710. The access key module 704 and security key module 706 are configured to store the product's corresponding access key and security key, respectively. Other modules of memory 702*b* may interact with access key module 704 and security key module 706. For example security module 708, which includes the security algorithms for the product (e.g., encryption/decryption algorithms, MAC generation/verification algorithms, etc.), may retrieve an access key from access key module 704 when generating a challenge to be sent to a user device. As another example, security module 708 may access security key module 708 to retrieve a security key to decrypt an encrypted user profile received from a user device. Control module 710 contains the software configured to interact with the other modules of memory 702*b* to implement the techniques disclosed herein with respect to a product. For example, in an embodiment where product 700 is a lock, after being awoken, control module 710 may attempt to pair/communicate with a user device (via wireless transceiver 702*d*). Control module 710 may also include operating system (e.g., an embedded operating system, firmware, etc.) software for product 700. As another example, control module 710 may request security module 708 to access a user profile and request to determine an action to be taken. Based on the permissions of the user profile and the request, control module 710 may determine whether or not to take a request action. For example, control module 710 may generate the signals necessary to control mechanical (and electronic) components of product 700 (e.g., lock mechanisms 702*f*) in response to a request (e.g., an unlock request for a lock, etc.). As another example, control module 710 may interface with lock mechanisms 702*f* to control a user's physical interactions with a lock (e.g., control module 710 may receive input from a dial interface, a key code interface, buttons, touch interface, etc.) in order to unlock a shackle of the lock.

In some embodiments, product 700 may include a location determination circuit 702*g*, such as a Global Positioning System (GPS) device/receiver, that may determine one or more locations of product 700 at one or more times. In some such embodiments, memory 702*b* may include a position tracking module 712 configured to receive the location data from location determination circuit 702*g* and store data indicative of the location or position of product 700 at one or more times. One such embodiment is discussed below with respect to FIG. 8.

Wireless transceiver 702*d* includes communications hardware (e.g., Bluetooth components, radiofrequency components, NFC components, ZigBee components, RFID components, Wi-Fi components, etc.) for wirelessly communication with another device (e.g., user devices 500, servers 600, etc.). In some embodiment, product 700 includes a battery 702*e* for providing power to the product. In an embodiment where product 700 is a lock, lock mechanism(s) 702*f* includes one or more physical and/or electronic locking mechanisms (e.g., pins, shackles, dials, buttons, shafts, keyholes, etc.) as discussed herein. For example, lock mechanism(s) 702f may correspond to lock mechanisms 106g.

Figure 8:
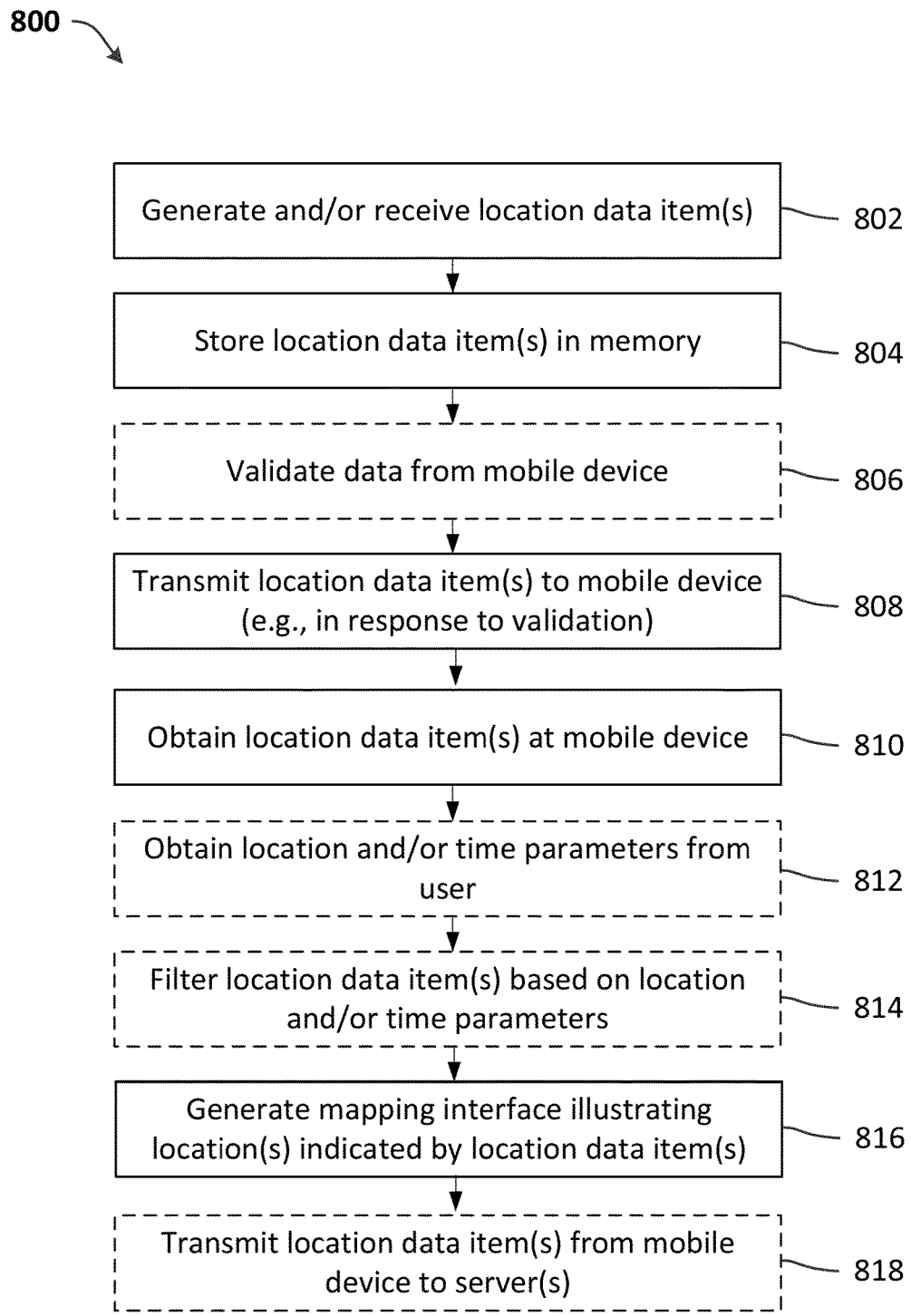
FIG. 8 is a flow diagram of a process for determining location data for a product and, optionally, generating a mapping interface indicating the determined location(s), according to one embodiment.

In some embodiments, a product (e.g., locking device) may include a location determination circuit (e.g., GPS receiver), and may generate and store location information for the lock. Referring now to FIG. 8, a flow diagram of a process 800 for collecting location data for a product and displaying the location data on a mapping interface of a mobile device is shown according to an exemplary embodiment. While process 800 illustrates providing a mapping interface, it should be appreciated that, in some embodiments, the product may generate/receive location data for the locking device, store the data, and/or transmit the data to the mobile device and/or one or more servers without the mobile device/server(s) generating mapping interfaces.

The product may generate and/or receive one or more location data items indicating a location of the product at one or more times (802). In some embodiments, the location data items may be generated by a location determination circuit, such as a GPS receiver, and may be transmitted to one or more processors of the product. The location data items may be stored in a memory (804).

The product may receive a request to transmit data to a mobile device. In some embodiments, the request may specifically request location data from the product. In other embodiments, the request may be a connection request, and the product may transmit location data in response to successfully connecting with the mobile device. In some embodiments, the product may validate data from the mobile device before providing the mobile device with the location data (806). In some such embodiments, validation of the data may be performed using a process similar to that described above with reference, for example, to FIGS. 2 and 3 (e.g., transmitting a challenge, verifying the response to the challenge, validating the data using a secret key, etc.). The product may transmit the location data items to the mobile device (808). In some embodiments, the product may only transmit the location data items to the mobile device if the data is validated.

The mobile device may obtain the location data item(s) from the product (810). In some embodiments, the mobile device may also obtain location and/or time parameters from a user for use in generating a mapping interface (812). For instance, location parameters may specify one or more location areas (e.g., buildings, geographic areas, etc.) to which locations displayed in the mapping interface should be restricted. In one such implementation, the location parameters may be based on current settings (e.g., geographic focus and/or zoom level) of a mapping interface. Time parameters may restrict a time associated with the results. For instance, in some embodiments, the user may indicate a desire to see only the last known location of the product. In some embodiments, the user may wish to see only locations during the past week. The mobile device may filter the location data item(s) based on the location and/or time parameters (e.g., before generating the mapping interface) (814). For example, items that do not fulfill the parameters may be removed from the set of data to be displayed within the mapping interface.

The mobile device may generate a mapping interface illustrating one or more locations indicated by the one or more location data items (e.g., filtered items) (816). In some implementations, the mobile device may be configured to generate the entire rendered mapping interface, including buildings, points of interest, and/or other mapping elements. In some implementations, the mobile device may illustrate the location information as an overlay on a mapping interface generated by a third party, such as a mapping interface that permits the addition/overlay of custom location points. The mapping interface may be transmitted to a display of the mobile device. In some implementations, the location data item(s) may be transmitted to one or more server(s) (818). For instance, in one implementation, the mobile device may be configured to illustrate a last known location of the product, and an interface administered by the server(s) may allow a user to see several different locations over a specified timeframe.

Figure 9:
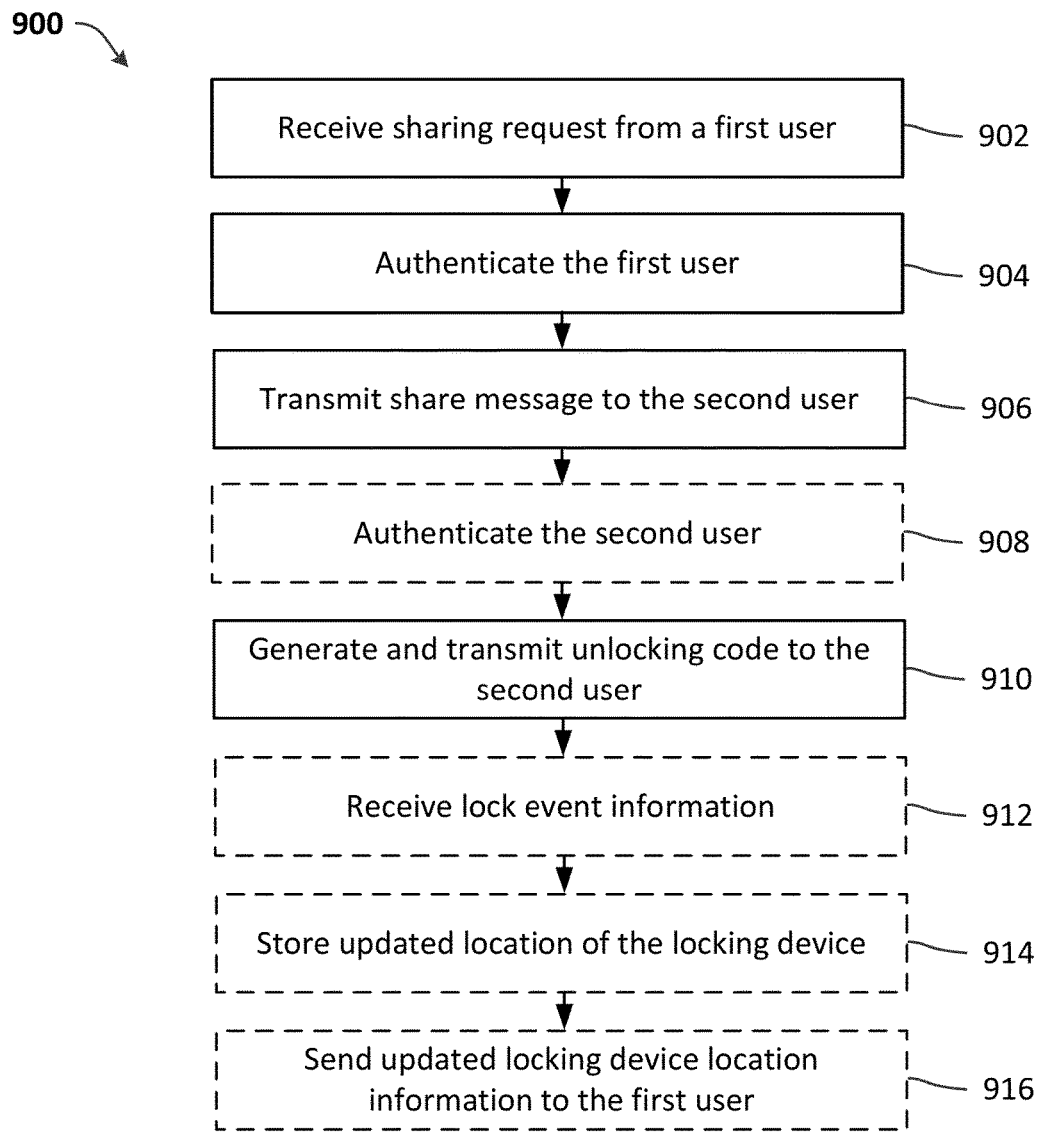
FIG. 9 is a flow diagram of a process for facilitating the sharing of a product unlock code and a product location between a first user and a second user, according to one embodiment.

In some embodiments, the collected location data may be used to facilitate sharing of an unlocking code for the locking device. For example, as described below with respect to process 900, a first user of the locking device, such as an owner of the locking device, can share an unlocking code along with the GPS coordinates of the locking device with a second user. Referring to FIG. 9, a flow diagram of a process 900 for facilitating the sharing of a product unlock code and a product location between a first user and a second user is shown according to an exemplary embodiment.

Process 900 begins when a sharing request is received from a first user (902). The sharing request is received by a backend server (e.g., server 104). The sharing request is initiated from the first user via a computing device, such as a smartphone running a system application, a laptop or desktop through a system website, or the like. The sharing request generally relates to a request from the owner or an authorized user of the locking device to provide guest access to a second user. The guest access includes an unlock code for the locking device. The unlock code provided to the second user may be a limited unlock code. For example, the unlock code may be a one-time use unlock code (i.e., allowing the secondary user to unlock the locking device only once), an unlock code that is valid for a limited number of unlocking events, a time or day limited unlock code that is only valid during certain time periods or a certain date range, or an expiring unlock code that expires after a designated time period. The sharing request may include a first user identifier, a locking device identifier (corresponding to the locking device), and a second user identifier. The sharing request may include any restrictions on the unlocking privileges to be provided to the second user (e.g., expiration, number of uses, time of acceptable use, day of acceptable use, etc.). The first user identifier and the second user identifier may include any of e-mail addresses, phone numbers, usernames, and other information used in verifying the identity of the first and second users.

After the sharing request is received, the first user is authenticated (904). In some embodiments, the backend server authenticates the first user as an owner or as an authorized user of the locking device (e.g., an individual or entity that has unlocking code sharing privileges associated with the locking device). The first user is authenticated based at least in part on the first user identifier. During the authentication, the backend server may prompt the first user via the computing device to provide a password or a PIN to complete the authentication process. If the backend server is able to authenticate the first user as the owner of the locking device or as an authorized user of the locking device, process 900 continues. In some arrangements, a message may be transmitted to the first user that indicates the successful authentication. The message may include updated locking device status information, such as a low battery warning. If the backend server is unable to authenticate the first user, process 900 ends. In some embodiments, authentication may be performed without use of the backend server, such as by using authentication data (e.g., a list of authorized identifiers) stored on the device of the second user.

After the first user is authenticated at 904, a share message is transmitted to the second user (906). In some embodiments, the share message is transmitted to the second user by the backend server. The share message may be an e-mail message, a text message, an application notification (e.g., if the second user is known a registered user of the locking device authentication system, and alert may be pushed to the user via a system application running on the second user's computing device), etc. The share message type may be determined based on information contained in the sharing request (e.g., the second user identifier). The share message indicates that the first user wants to provide the second user the ability to unlock the locking device. The share message may include an option to reject the share request. For example, in some arrangements, the second user may not want to access the locking device, and the user is presented with the option to reject the share request. In some arrangements, after the share message is sent to the second user at 906, the second user is authenticated (908). The locking device system may require that the second user (e.g., the guest user) be a registered user of the system. In such arrangements, the share message may invite the second user to either log in to the locking device system or to register as a user of the locking device system in order to gain access to the unlocking privilege for the locking device. In arrangements where the second user is authenticated, the location information of the locking device may be omitted from the original share message and sent in a follow-up message after the second user has been authenticated. In other arrangements, the second user does not need to be a registered user to receive the share message.

An unlock code is generated and transmitted to the second user (910). In some embodiments, the unlock code is generated by the backend server and transmitted to the second user via a locking device system application on a computing device associated with the second user. Generating and transmitting the unlock code may include generating and encrypting a user profile and access key later used to unlock the locking device (as described above in process 200 in FIG. 2). In some arrangements, the unlock code is transmitted along with location information relating to the location of the locking device. In some embodiments, the location information may include an address of the location of the locking device, a map showing the location of the locking device, or a combination thereof. In some embodiments, the location information may include data (e.g., a position identifier, such as GPS coordinates) that an application operating on the second device may use to generate data to present (e.g., display) to the second user, such as an address, map, driving/walking directions, etc. The second user can utilize the unlock code via the second user's computing device to unlock the locking device in a similar manner as described above with respect to process 300 in FIG. 3.

After the second user interacts with the locking device, lock event information may be received (912). The lock event information may relate to an unlock event, in which the locking device is unlocked, or a lock event, in which the locking device is locked. In each situation, the second user's computing device (e.g., a smartphone) may transmit the lock event information to the backend server. The lock event information may include an indication that the second user either locked or unlocked the locking device, a time of the lock event, and an updated location of the locking device (as determined by the second user's computing device). The updated location of the locking device may be obtained as described above in process 800 in FIG. 8.

The received lock event information may be stored (914). In some embodiments, the backend server stores the lock event information and updates the last known location of the locking device based on the locking device location information received in the lock event information. In some arrangements, an alert is sent to the first user (916). The alert is sent from the backend server to the first user via e-mail, text message, application notification, or the like. The alert includes an indication of the lock event. In some arrangements, the alert also includes updated location information relating to the locking device. In some embodiments, data (e.g., the alert) may be transmitted between the first and second user devices without using the backend server as an intermediary system.

The above-described process 900 can be applied in many different scenarios. For example, method 900 may be applicable in a real estate showing scenario where the locking device is a realtor key box. In such a scenario, a listing agent may be the first user (i.e., the owner or operator of the realtor key box) and the listing agent can share the key code, along with the location of the key box for a property, with a second agent or a potential buyer of the property. The key box unlock code and location sharing may be facilitated through a realtor management mobile application. As another example, process 900 may be applicable in an equipment sharing program (e.g., a bike sharing system) in which various users share the equipment. In such a scenario, each piece of equipment may be associated with a locking device. When a user wants to use a piece of equipment (e.g., a bike in a bike share program), the user can access his locking device application, receive the location of the nearest equipment (as defined by the location of the associated locking device), and receive the locking code to unlock the equipment. When the locking device is relocked (e.g., when the user is done using the bike), the location of the equipment may be uploaded back to the server with the locking event such that the equipment can be located for the next user.

Figure 10:
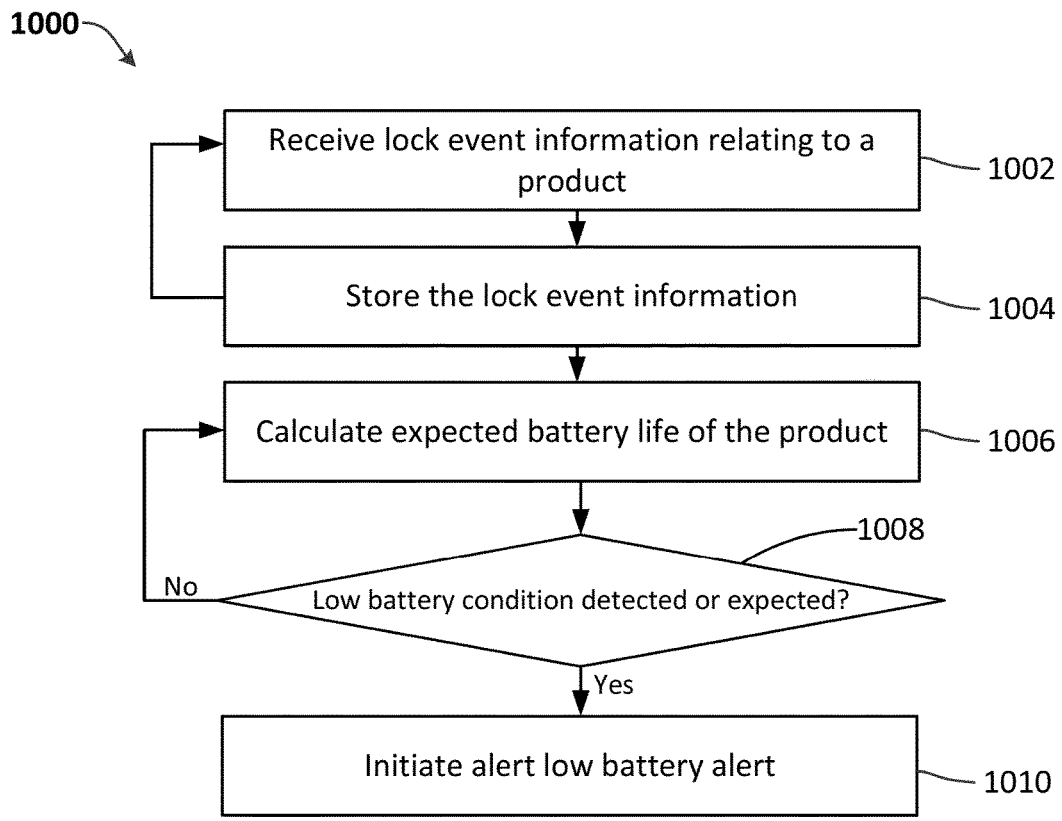
FIG. 10 is a flow diagram of a process of estimating battery life based at least in part on an actual usage audit trail and initiating low battery alerts to users, according to one embodiment.

In some embodiments, a backend server (e.g., server 104) calculates an expected battery life of a product (e.g., a locking device, product 106, product 700, etc.) and initiates low battery alerts to users based at least in part on the actual usage history of the product. Referring to FIG. 10, a flow diagram of a process 1000 of estimating battery life based at least in part on an actual usage audit trail and initiating low battery alerts to users is shown according to an exemplary embodiment.

Process 1000 begins when lock event information relating to the product is received (1002). The lock event information relates to a lock event (e.g., a locking or unlocking of the product as described above with respect to processes 200, 300, and 800). The lock event information includes a time and date of the lock event and product battery information. The battery information may include a voltage level. The lock event information may also include any of a location of the product at the time of the locking or unlocking (as described above with respect to process 800), an identity of a user that locks or unlocks the product, and an identity of the product (e.g., a serial number).

The lock event information is stored (1004). In some embodiments, the backend server stores the lock event information in a database of lock event information stored on the backend server. The lock event information may be associated with the particular product in the database (e.g., based on the serial number of the product). The backend server may store each lock event associated with the product in the database. The backend server can analyze the database to form a historical analysis of the usage of the product, which is herein referred to as an audit trail. The audit trail of the product can be analyzed to determine usage statistics of the product. The usage statistics may include various metrics such as an average time (e.g., number of hours, number of days, etc.) between lock events (e.g., unlockings and lockings), the amount of awake time or sleep time, battery statistics (e.g., voltage/state of charge/discharge readings at lock events, time since last battery replacement or recharge, etc.), location information (e.g., the location of the product at each lock event), and the like. The audit trail can also be used by the backend server to predict future usage (e.g., the timing and/or frequency of future lock events) based on the historical usage of the product. The future usage may relate to an estimated amount of time (e.g., number of hours, number of days, etc.) until the next lock event.

The expected battery life of the product is calculated (1006). In some embodiments, the backend server calculates the expected battery life of the product based on the audit trail (both historical usage information and predicted future information) and based battery characteristics (e.g., the battery's age, the battery's capacity, etc.). The expected battery life may be calculated in estimated number of days remaining. For example, the backend server may determine the average amount of battery used for each lock event, determine the amount of battery consumed for standby time between lock events, and determine an expected life of the battery in days based on the average number of days between historical lock events (i.e., the predicted amount of time from the lock event until the next lock event). The determined battery condition may be adjusted based on weather predictions for the location of the product. The weather prediction may be pulled from a third-party weather service. For example, in certain cold or hot conditions, the product may consumer more battery than in normal operating conditions. In some situations, the lock event information includes an expected battery life. For example, the product may transmit (via a user's computing device) a low battery warning indicating the battery has a limited amount of life or charge remaining. In other embodiments, the battery life may be calculated on the locking device itself, rather than or in addition to at the backend server.

Based on the calculated expected battery life, the backend server determines whether a low battery life condition is expected (1008). In some embodiments, a low battery life condition is expected if the battery of the product is expected to fully discharge before the next expected or predicted lock event (based on historical product usage statistics and predicted time until the next lock event). In such an embodiment, the low battery life condition may be expected if the battery has below the threshold amount of battery capacity remaining needed by the product to last until the predicted next lock event. In some embodiments, a low battery life condition may be triggered when the remaining battery life is less than that expected to be needed to power the locking device through a predetermined number of further lock events.

If a low battery condition is expected, the backend system initiates an alert to a user of the product (1010). The alert may be an e-mail message, a text message, an application message, etc. In some embodiments, the alert includes an indication to the user that the battery is expected to die before the next lock event, within a predetermined number of lock events, etc. The alert may include replacement battery information, such as the type of battery the user needs to purchase and battery replacement instructions. The alert may include a listing of retailers in the vicinity of the product or the user (e.g., within a threshold number of miles from the product or the user) that carry replacement batteries for the product. In some arrangements, the alert includes a map providing the location of the product. The map may include the nearest retailers that carry replacement batteries for the product. If a low battery is not expected, process 1000 returns to calculating the expected battery life of the product at 1006. The backend server may continuously or periodically calculate and monitor the expected battery life of the product until a low battery alert is initiated by the backend server to a user associated with the product.

Figure 11:
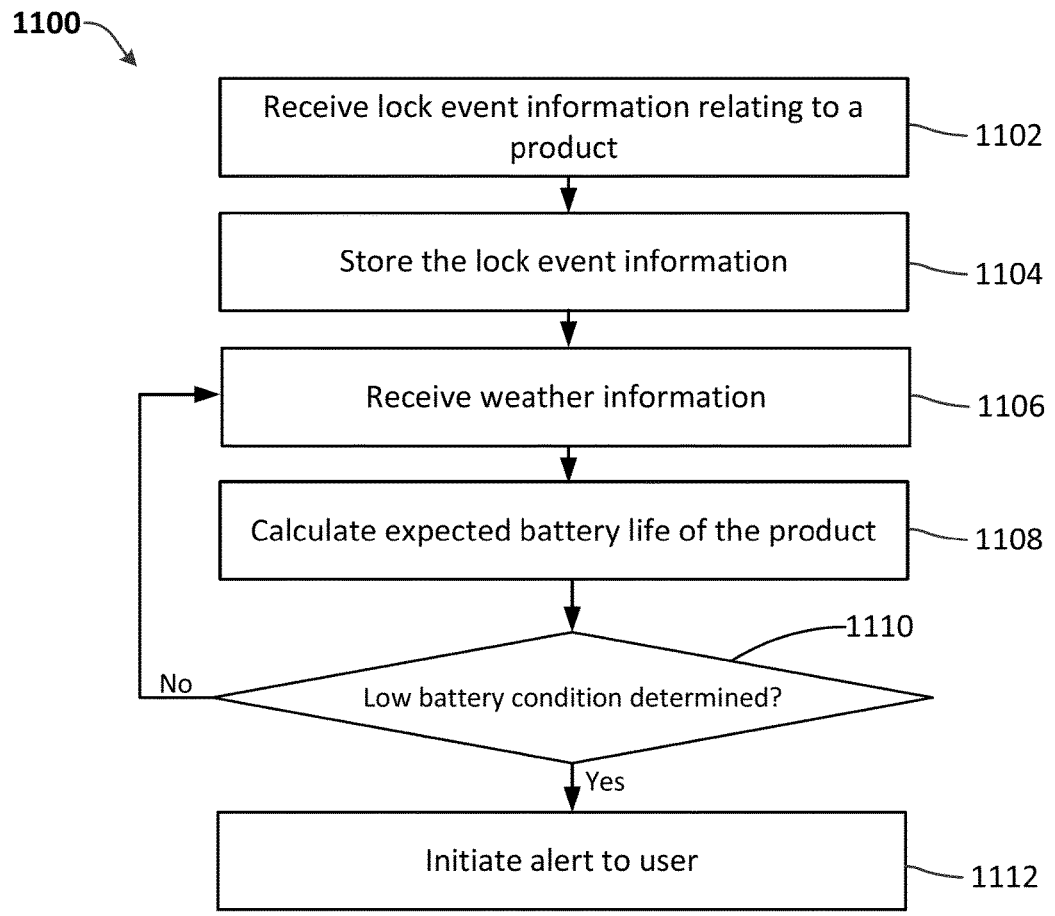
FIG. 11 is a flow diagram of a process of estimating battery life based at least in part on an the location of the product and initiating low battery alerts to users, according to one embodiment.

In further embodiments, a backend server (e.g., server 104) calculates an expected battery life of a product (e.g., a locking device, product 106, product 700, etc.) and initiates low battery alerts to users based at least in part on the location of the product. Referring now to FIG. 11, a flow diagram of a process 1100 of estimating battery life based at least in part on an the location of the product and initiating low battery alerts to users is shown according to an exemplary embodiment. Process 1100 begins when lock event information relating to the product is received (1102). The lock event information relates to a lock event (e.g., a locking or unlocking of the product as described above with respect to processes 200, 300, and 800). The lock event information includes a time and date of the lock event and product battery information. The battery information may include a voltage level. The lock event information also includes a location of the product at the time of the locking or unlocking (as described above with respect to process 800). The lock event information may also include an identity of a user that locks or unlocks the product and an identity of the product (e.g., a serial number).

The lock event information is stored (1104). In some embodiments, the backend server stores the lock event information in a database of lock event information. The lock event information is associated with the particularly product in the database (e.g., based on the serial number of the product). The backend server stores each lock event associated with the product in the database. The stored lock event information of the product can be analyzed to determine historical usage statistics of the product and to predict future usage of the product. The usage statistics may include various metrics such as an average time (e.g., number of hours, number of days, etc.) between lock events (e.g., unlockings and lockings), the amount of awake time or sleep time, batter statistics (e.g., voltage readings at lock events, time since last battery replacement or recharge, etc.), location information (e.g., the location of the product at each lock event), and the like.

Weather information is received (1108). The backend server receives weather information associated with the location of the product. In some arrangements, the lock event information includes the location of the product. In other arrangements, a user of the lock manually provides the location of the product to the backend system (e.g., through interaction with a system application). The weather information for the location of the product is received from a third-party weather service. The backend server may request (i.e., pull) the weather information from the third-party weather service. The weather information may include various weather conditions, such as temperature, humidity, precipitation, cloud coverage, and the like. The weather information may be received for weather conditions at the time of the lock event, during times between lock events, and historical weather conditions from prior to the lock event. The received weather information may be stored in the database (in a similar manner as described above with respect to 1104). Updated weather information may be pulled by the backend server at regular intervals (e.g., hourly, once a day, once a week, etc.). The expected battery life of the product is calculated (1108). In some embodiments, the backend server calculates the expected battery life of the product based on the audit trail and base battery characteristics (e.g., the battery's age, the battery's capacity, etc.). The expected battery life may be calculated in estimated number of days remaining. For example, the backend server may determine the average amount of battery used for each lock event, determine the amount of battery consumed for standby time between lock events, and determine an expected life of the battery in days based on the average number of days between historical lock events. The expected battery life is adjusted (e.g., increased or decreased) based on the weather information received at 1106. For instance, in some embodiments, the weather information may be a factor considered in calculating the expected battery life. In certain cold or hot conditions, the battery may be adversely affected in terms of battery life as compared to ideal battery operating conditions. For example, if the product is outside during a winter storm with abnormally cold temperatures, such as 10 degrees Fahrenheit, the battery life of the product may be negatively impacted. The battery life adjustments based on weather are continuously or repeatedly performed (e.g., once an hour, once a day, once a week, etc.).

Based on the calculated expected battery life, the backend server determines whether a low battery life condition is determined (1110). In some embodiments, a low battery life condition occurs when the battery of the product is estimated (based on the usage information and the weather information) to fall below a threshold level of charge (e.g., a threshold voltage level). If a low battery life condition is not determined, the process 1100 returns to receiving updated weather information (1106) and calculated expected battery life (1108) for updating the calculated expected battery life. If a low battery condition is determined, the backend system initiates an alert to a user of the product (1112). The alert may be an e-mail message, a text message, an application message, etc. The alert includes an indication to the user that the product batter has reached a low level of charge. The alert may include replacement battery information, such as the type of battery the user needs to purchase and battery replacement instructions. The alert may include a listing of retailers near the product or the user that carry replacement batteries for the product. In some arrangements, the alert includes a map providing the location of the product. The map may include the nearest retailers that carry replacement batteries for the product.

Reference in this specification to "one embodiment," "some embodiments," or "an embodiment" means that a particular feature, structure, or characteristic described in connection with the embodiment is included in at least one embodiment. The appearance of the phrase "in one embodiment" or "in some embodiments" in various places in the specification is not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The disclosure is described above with reference to drawings. These drawings illustrate certain details of specific embodiments that implement the systems and methods and programs of the present disclosure. However, describing the disclosure with drawings should not be construed as imposing on the disclosure any limitations that may be present in the drawings. The present disclosure contemplates methods, systems and program products on any machine-readable media for accomplishing its operations. The embodiments of the present disclosure may be implemented using an existing computer processor, or by a special purpose computer processor incorporated for this or another purpose or by a hardwired system. No claim element herein is to be construed under the provisions of 35 U.S.C. § 112, sixth paragraph, unless the element is expressly recited using the phrase "means for." Furthermore, no element, component or method step in the present disclosure is intended to be dedicated to the public, regardless of whether the element, component or method step is explicitly recited in the claims.

Embodiments within the scope of the present disclosure include program products comprising machine-readable storage media for carrying or having machine-executable instructions or data structures stored thereon. Such machine-readable media can be any available media which can be accessed by a general purpose or special purpose computer or other machine with a processor. By way of example, such machine-readable media can comprise RAM, ROM, EPROM, EEPROM, CD ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions comprise, for example, instructions and data which cause a general purpose computer, special purpose computer, or special purpose processing machine to perform a certain function or group of functions. While a computer or machine-readable storage medium is not a propagated signal (i.e., is tangible and non-transitory), a computer or machine-readable storage medium can be a source or destination of computer program instructions encoded in an artificially-generated and propagated signal.

Embodiments of the disclosure are described in the general context of method steps which may be implemented in one embodiment by a program product including machine-executable instructions, such as program code, for example, in the form of program modules executed by machines in networked environments. Generally, program modules include routines, programs, objects, components, data structures, etc., that perform particular tasks or implement particular abstract data types. Machine-executable instructions, associated data structures, and program modules represent examples of program code for executing steps of the methods disclosed herein. The particular sequence of such executable instructions or associated data structures represent examples of corresponding acts for implementing the functions described in such steps.

Embodiments of the present disclosure may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the Internet and may use a wide variety of different communication protocols. Those skilled in the art will appreciate that such network computing environments will typically encompass many types of computer system configurations, including personal computers, hand-held devices, mobile phones, multi-processor systems, microprocessor-based or programmable consumer electronics, network PCs, servers, minicomputers, mainframe computers, and the like. Embodiments of the disclosure may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing the overall system or portions of the disclosure might include a general purpose computing device in the form of a computer, including a processing unit, a system memory, and a system bus that couples various system components including the system memory to the processing unit. The system memory may include read only memory (ROM) and random access memory (RAM). The computer may also include a magnetic hard disk drive for reading from and writing to a magnetic hard disk, a magnetic disk drive for reading from or writing to a removable magnetic disk, and an optical disk drive for reading from or writing to a removable optical disk such as a CD-ROM or other optical media. The drives and their associated machine-readable media provide nonvolatile storage of machine-executable instructions, data structures, program modules, and other data for the computer.

It should be noted that although the flowcharts provided herein show a specific order of method steps, it is understood that the order of these steps may differ from what is depicted. Also, two or more steps may be performed concurrently or with partial concurrence. Such variation will depend on the software and hardware systems chosen and on designer choice. It is understood that all such variations are within the scope of the disclosure. Likewise, software and web implementations of the present disclosure could be accomplished with standard programming techniques with rule based logic and other logic to accomplish the various database searching steps, correlation steps, comparison steps and decision steps. It should also be noted that the word "component" as used herein and in the claims is intended to encompass implementations using one or more lines of software code, and/or hardware implementations, and/or equipment for receiving manual inputs.

The foregoing description of embodiments of the disclosure have been presented for purposes of illustration and description. It is not intended to be exhaustive or to limit the disclosure to the precise form disclosed, and modifications and variations are possible in light of the above teachings or may be acquired from practice of the disclosure. The embodiments were chosen and described in order to explain the principals of the disclosure and its practical application to enable one skilled in the art to utilize the disclosure in various embodiments and with various modifications as are suited to the particular use contemplated.

The invention claimed is:

1. A method of predicting a battery life of an electronic locking product based at least in part on a usage history of the electronic locking product, the method comprising:
   receiving, by a server, lock event information associated with a lock event of the electronic locking product from a portable device;
   storing, in a database of the server, the lock event information, wherein the lock event information is associated with the electronic locking product in the database;
   calculating, by the server, an expected battery life of a battery of the electronic locking product using the lock event information, the expected battery life comprising an expected amount of time associated with a remaining charge of the battery based at least in part on usage indicated by the lock event information;
   predicting, by the server, an estimated amount of time until a predicted next lock event;
   determining, by the server, that the expected battery life of the battery is below a threshold value, wherein the threshold value relates to an estimated amount of battery capacity needed by the electronic locking product during the estimated amount of time until the predicted next lock event; and
   initiating, by the server, an alert to a user computing device indicating a low battery condition of the battery in response to determining that the expected battery life is below the threshold value.

2. The method of claim 1, wherein the lock event information includes a location of the electronic locking product, the method further comprising:
   receiving, by the server, weather information from a weather service based on the location of the electronic locking product; and
   adjusting, by the server, the expected battery life of the battery based on the weather information.

3. The method of claim 1, wherein the portable device and the user computing device are the same device.

4. The method of claim 1, further comprising identifying, by the server or the user computing device, at least one retailer in the vicinity of at least one of the electronic locking product, the portable device, or the user computing device that carries replacement batteries for the electronic locking product, wherein the alert includes an identification of the at least one retailer.

5. The method of claim 4, wherein the alert further includes a map providing a location of at least one of the electronic locking product, the portable device, the user computing device, or the at least one retailer.

6. A system comprising:
   a computing device comprising a processor operably coupled to a memory and configured to:
   receive lock event information associated with a lock event of an electronic locking product;
   store the lock event information in a database, wherein the lock event information is associated with the electronic locking product in the database;
   calculate an expected battery life of a battery of the electronic locking product using the lock event information, the expected battery life comprising an expected amount of time associated with a remaining charge of the battery based at least in part on usage indicated by the lock event information;
   estimate an amount of time until a predicted next lock event
   determine that the expected battery life of the battery is below a threshold value, wherein the threshold value relates to an estimated amount of battery capacity needed by the electronic locking product during the estimated amount of time until the predicted next lock event; and
   initiate an alert indicating a low battery condition of the battery.

7. The system of claim 6, wherein the lock event information includes a location of the electronic locking product, and wherein the processor is further configured to receive weather information from a weather service based on the location of the electronic locking product.

8. The system of claim 7, wherein the processor is further configured to adjust the expected battery life of the battery based on the weather information.

9. The system of claim 6, wherein the processor is further configured to identify at least one retailer in the vicinity of at least one of the electronic locking product or the computing device that carries replacement batteries for the electronic locking product, wherein the alert includes an identification of the at least one retailer, wherein the alert further includes a map providing a location of at least one of the electronic locking product, the at least one retailer, or the computing device.

10. The system of claim 6, further comprising the electronic locking product, the electronic locking product comprising:
  the battery;
  a wireless transceiver;
  an electronically controllable locking mechanism; and
  a second processor configured to lock and unlock the electronically controllable locking mechanism and transmit information using the wireless transceiver to the computing device.

11. The system of claim 10, wherein the computing device comprises a server, and wherein the server is configured to receive the information from the electronic locking product via a second computing device.

12. A non-transitory computer-readable storage medium having instructions stored thereon that, upon execution by a processor of a computing device, cause the processor to:
  receive lock event information associated with a lock event of an electronic locking product;
  store the lock event information in a database, wherein the lock event information is associated with the electronic locking product in the database;
  calculate an expected battery life of a battery of the electronic locking product using the lock event information, the expected battery life comprising an expected amount of time associated with a remaining charge of the battery based at least in part on usage indicated by the lock event information;
  estimate an amount of time until a predicted next lock event
  determine that the expected battery life of the battery is below a threshold value, wherein the threshold value relates to an estimated amount of battery capacity needed by the electronic locking product during the estimated amount of time until the predicted next lock event; and
  initiate an alert on at least one of the computing device or a second computing device indicating a low battery condition of the battery.

13. The non-transitory computer-readable storage medium of claim 12, wherein the lock event information includes a location of the electronic locking product, and wherein the instructions cause the processor to at least one of (i) determine the location of the electronic locking product and append the location to the lock event information or (ii) receive the location of the electronic locking product with the lock event information.

14. The non-transitory computer-readable storage medium of claim 13, wherein the instructions cause the processor to:
  receive weather information from a weather service based on the location of the electronic locking product; and
  adjust the expected battery life of the battery based on the weather information.

15. The non-transitory computer-readable storage medium of claim 13, wherein the instructions cause the processor to identify at least one retailer in the vicinity of at least one of the electronic locking product, the computing device, or the second computing device that carries replacement batteries for the electronic locking product, wherein the alert includes at least one of (i) an identification of the at least one retailer and (ii) a map providing the location of at least one of the electronic locking product, the at least one retailer, the computing device, or the second computing device.

* * * * *